(12) United States Patent
Conway et al.

(10) Patent No.: US 9,179,518 B2
(45) Date of Patent: Nov. 3, 2015

(54) LIGHT EMISSIVE DEVICE

(75) Inventors: Natasha M. Conway, Cambridge (GB);
Nalinkumar Patel, Cambridge (GB);
Richard Wilson, Cambridge (GB);
Ilaria Grizzi, Cambridge (GB)

(73) Assignees: CAMBRIDGE DISPLAY TECHNOLOGY LIMITED, Cambridgeshire (GB); CDT OXFORD LIMITED, Cambridgeshire (GB)

( * ) Notice: Subject to any disclaimer, the term of this patent is extended or adjusted under 35 U.S.C. 154(b) by 2222 days.

(21) Appl. No.: 11/722,791

(22) PCT Filed: Dec. 23, 2005

(86) PCT No.: PCT/GB2005/005082
§ 371 (c)(1),
(2), (4) Date: Oct. 16, 2007

(87) PCT Pub. No.: WO2006/067508
PCT Pub. Date: Jun. 29, 2006

(65) Prior Publication Data
US 2008/0197768 A1    Aug. 21, 2008

(30) Foreign Application Priority Data

Dec. 24, 2004 (GB) ................................. 0428413.9
Jul. 14, 2005 (GB) ................................. 0514498.5
Oct. 11, 2005 (WO) ............... PCT/GB2005/003892

(51) Int. Cl.
*H01J 1/62* (2006.01)
*H01J 9/22* (2006.01)
(Continued)

(52) U.S. Cl.
CPC ................. *H05B 33/14* (2013.01); *C09K 11/06* (2013.01); *H01L 51/5036* (2013.01);
(Continued)

(58) Field of Classification Search
USPC ........................................................ 428/690
See application file for complete search history.

(56) References Cited

U.S. PATENT DOCUMENTS

| 4,539,507 A | 9/1985 | VanSlyke et al. |
| 5,150,006 A | 9/1992 | Van Slyke et al. |

(Continued)

FOREIGN PATENT DOCUMENTS

| EP | 0 643 549 A1 | 3/1995 |
| EP | 0 707 020 A2 | 4/1996 |

(Continued)

OTHER PUBLICATIONS

Bernius et al., "Progress with Light-Emitting Polymers," *Adv. Mater.*, 12(23):1737-1750 (2000).

(Continued)

*Primary Examiner* — J. L. Yang
(74) *Attorney, Agent, or Firm* — Marshall, Gerstein & Borun LLP

(57) ABSTRACT

An organic light emissive device, which comprises: an anode; a cathode; and an organic light emissive region between the anode and the cathode, which region comprises: a layer of blue light electroluminescent organic material which emits light having first CIE co-ordinates by exciton radiative decay; and a layer of longer wavelength electroluminescent organic material which intrinsically emits light having second CIE co-ordinates by exciton radiative decay; wherein the layers of blue light and longer wavelength materials are selected so that the organic light emissive region emits white light falling within a region having a CIE $\chi$ coordinate equivalent to that emitted by a black body at 3000-9000K and CIE $\gamma$ co-ordinate of said light emitted by a black body.

19 Claims, 5 Drawing Sheets

(51) Int. Cl.
H05B 33/14 (2006.01)
C09K 11/06 (2006.01)
H01L 51/50 (2006.01)
H01L 51/00 (2006.01)

(52) U.S. Cl.
CPC ............... C09K 2211/1416 (2013.01); C09K 2211/1425 (2013.01); C09K 2211/1433 (2013.01); C09K 2211/1458 (2013.01); C09K 2211/1483 (2013.01); H01L 51/0036 (2013.01); H01L 51/0037 (2013.01); H01L 51/0039 (2013.01); H01L 51/0043 (2013.01); Y02B 20/181 (2013.01)

(56) References Cited

U.S. PATENT DOCUMENTS

| | | | |
|---|---|---|---|
| 5,432,014 | A | 7/1995 | Sano et al. |
| 5,621,131 | A | 4/1997 | Kreuder et al. |
| 5,683,823 | A | 11/1997 | Shi et al. |
| 5,723,873 | A | 3/1998 | Yang |
| 5,798,170 | A | 8/1998 | Zhang et al. |
| 5,807,627 | A | 9/1998 | Friend et al. |
| 6,083,634 | A | 7/2000 | Shi |
| 6,127,693 | A | 10/2000 | Chen et al. |
| 6,268,695 | B1 | 7/2001 | Affinito |
| 6,353,083 | B1 | 3/2002 | Inbasekaran et al. |
| 6,953,628 | B2 | 10/2005 | Kamatani et al. |
| 7,030,138 | B2 | 4/2006 | Fujimoto et al. |
| 7,094,477 | B2 | 8/2006 | Kamatani et al. |
| 7,125,998 | B2 | 10/2006 | Stossel et al. |
| 7,147,935 | B2 | 12/2006 | Kamatani et al. |
| 7,238,435 | B2 | 7/2007 | Kamatani et al. |
| 2002/0117662 | A1 | 8/2002 | Nii |
| 2002/0182441 | A1 | 12/2002 | Lamansky et al. |
| 2003/0022409 | A1* | 1/2003 | Epstein et al. ............. 438/38 |
| 2003/0059975 | A1 | 3/2003 | Sirringhaus et al. |
| 2004/0029364 | A1* | 2/2004 | Aoki et al. ............. 438/478 |
| 2004/0077824 | A1* | 4/2004 | O'Dell et al. ............. 528/394 |
| 2004/0127666 | A1* | 7/2004 | Inbasekaran et al. ............. 528/8 |
| 2004/0185300 | A1* | 9/2004 | Hatwar et al. ............. 428/690 |
| 2004/0232814 | A1 | 11/2004 | Sakai |
| 2005/0249972 | A1* | 11/2005 | Hatwar et al. ............. 428/690 |

FOREIGN PATENT DOCUMENTS

| | | |
|---|---|---|
| EP | 0 842 208 B1 | 5/1998 |
| EP | 0 901 176 A2 | 3/1999 |
| EP | 0 947 123 B1 | 10/1999 |
| EP | 0 949 850 A1 | 10/1999 |
| EP | 1 245 659 A1 | 10/2002 |
| EP | 1 434 284 A2 | 6/2004 |
| GB | 2 340 304 A | 2/2000 |
| GB | 2 348 316 A | 9/2000 |
| JP | 8-078163 | 3/1996 |
| JP | 2002-324679 | 11/2002 |
| JP | 2004-253370 A | 9/2004 |
| WO | WO-90/13148 | 11/1990 |
| WO | WO-94/29883 A1 | 12/1994 |
| WO | WO-96/20253 | 7/1996 |
| WO | WO-98/10621 | 3/1998 |
| WO | WO-98/57381 | 12/1998 |
| WO | WO-99/48160 | 9/1999 |
| WO | WO-00/46321 | 8/2000 |
| WO | WO-00/48258 | 8/2000 |
| WO | WO-00/53656 | 9/2000 |
| WO | WO-00/55927 | 9/2000 |
| WO | WO-00/79617 | 12/2000 |
| WO | WO-01/19142 | 3/2001 |
| WO | WO-01/47043 A1 | 6/2001 |
| WO | WO-01/62869 | 8/2001 |
| WO | WO-01/81649 | 11/2001 |
| WO | WO-02/26859 | 4/2002 |
| WO | WO-02/31896 | 4/2002 |
| WO | WO-02/44189 | 6/2002 |
| WO | WO-02/45466 | 6/2002 |
| WO | WO-02/066537 | 8/2002 |
| WO | WO-02/066552 | 8/2002 |
| WO | WO-02/068435 | 9/2002 |
| WO | WO-02/081448 | 10/2002 |
| WO | WO-02/084759 | 10/2002 |
| WO | WO-02/092723 | 11/2002 |
| WO | WO-03/022908 | 3/2003 |
| WO | WO-03/018653 | 6/2003 |
| WO | WO-03/095586 | 11/2003 |
| WO | WO-2004/061878 | 7/2004 |
| WO | WO-2004/084260 | 9/2004 |

OTHER PUBLICATIONS

Chen et al., "Bright White Polymer Double-Layer LEDs," *Polymer Preprints*, 41(1):835-836 (2000).
Chen et al., "Recent Developments in Molecular Organic Electroluminescent Materials," *Macromol. Symp.*, 125:1-48 (1997).
Chen et al., "Triplet Exciton Confinement in Phosphorsecent Polymer Light-Emitting Diodes," *Appl. Phys. Lett.*, 82(7):1006-1008 (2003).
Cleave et al., "Harvesting Singlet and Triplet Energy in Polymer LEDs," *Adv. Mater.*, 11(4):285-288 (1999).
Hatwar et al., "Development in Oled Formulations with Improved Efficiency and Stability," *Proceedings of the SPIE*, 5519:1-11 (2004).
Huang et al., "Novel Electroluminescent Conjugated Polyelectrolytes Based on Polyfluorene," *Chem. Mat.*, 16(4):708-716 (2004).
Herguth et al., "Highly Efficient Fluorene- and Benzothiadiazole-Based Conjugated Copolymers for Polymer Light-Emitting Diodes," *Macromolecules*, 35:6094-6100 (2002).
Ikai et al., "Highly Efficient Phosphorsecence from Organic Light-Emitting Devices with an Exciton-Block Layer," *Appl. Phys. Lett.*, 79(2):156-158 (2001).
Lane et al., "Origin of Electrophosphorescence from a Doped Polymer Light Emitting Diode," *Phys. Rev. B*, 63:235206-1-235206-8 (2001).
Lee et al., "Polymer Phosphorescent Light-Emitting Devices Doped with Tris(2-phenylpyridine) Iridium as a Triplet Emitter," *Appl. Phys. Lett.*, 77(15):2280-2282 (2000).
Niu et al., "Thermal Annealing Below the Glass Transition Temperature: A General Way to Increase Performance of Light-Emitting Diodes Based on Copolyfluorenes," *Appl. Phys. Lett.*, 81(4):634-636 (2002).
O'Brien et al., "Electrophosphoresence from a Doped Polymer Light Emitting Diode," *Synth. Met.*, 116:379-383 (2001).
Setayesh et al., "Bridging the Gap Between Polyfluorene and Ladder-Poly-*p*-Phenylene: Synthesis and Characterization of Poly-2,8-Indenofluorene," *Macromolecules*, 33:2016-2020 (2000).
Yamaguchi et al., "Effects of B and C on the Ordering of $L1_0$-CoPt Thin Films," *Appl. Phys. Lett.*, 79(13):2001-2003 (2001).
Yamamoto, "Electrically Conducting and Thermally Stable π-Conjugated Poly(arylene)s Prepared by Organometallic Processes," *Prog. Polym. Sci.*, 17:1153-1205 (1992).
Yang et al., "Efficient Blue Polymer Light-Emitting Diodes from a Series of Soluble Poly(paraphenylene)s," *J. Appl. Phys.*, 79(2):934-939 (1996).
Zhu et al., "Synthesis of New Iridium Complexes and Their Electrophosphorescent Properties in Polymer Light-Emitting Diodes," *J. Mater. Chem.*, 13:50-55 (2003).
Combined Search and Examination Report for Application No. GB0428413.9, dated May 20, 2005.
International Preliminary Report on Patentability for International Application No. PCT/GB2005/005082, dated Jun. 26, 2007.
International Search Report for International Application No. PCT/GB2005/005082, dated Apr. 11, 2006.
Written Opinion for International Application No. PCT/GB2005/005082, dated Apr. 11, 2006.
International Preliminary Report on Patentability for International Application No. PCT/GB2005/003892, dated Apr. 11, 2007.
International Search Report for International Application No. PCT/GB2005/003892, dated Jan. 16, 2006.

(56) References Cited

OTHER PUBLICATIONS

Written Opinion for International Application No. PCT/GB2005/003892, dated Jan. 16, 2006.
Combined Search and Examination Report for GB0422550.4, dated Jan. 31, 2005.

Office Action for corresponding European Patent Application No. 05 804 994.1-1235, dated Nov. 13, 2009.
Office Action for corresponding European Patent Application No. 05 804 994.1-1235, dated Oct. 21, 2008.
Office Action for corresponding European Patent Application No. 05 804 994.1-1235, dated Oct. 8, 2007.

* cited by examiner

EL Spectra

EL Spectra (DC)

LIGHT EMISSIVE DEVICE

The present invention relates to organic light emissive devices, to methods of making such devices and the use of such devices in lighting applications.

Organic light emissive devices (OLEDs) generally comprise a cathode, an anode and an organic light emissive region between the cathode and the anode. Light emissive organic materials may comprise small molecular materials such as described in U.S. Pat. No. 4,539,507 or polymeric materials such as those described in PCT/WO90/13148. The cathode injects electrons into the light emissive region and the anode injects holes. The electrons and holes combine to generate photons.

FIG. 1 shows a typical cross-sectional structure of an OLED. The OLED is typically fabricated on a glass or plastics substrate 1 coated with a transparent anode 2 such as an indium-tin-oxide (ITO) layer. The ITO coated substrate is covered with at least a layer of a thin film of an electroluminescent organic material 3 and cathode material 4 of low work function metal such as calcium is applied, optionally with a capping layer of aluminium (not shown). Other layers may be added to the device, for example to improve charge transport between the electrodes and the electroluminescent material.

There has been a growing interest in the use of OLEDs in display applications because of their potential advantages over conventional displays. OLEDs have relatively low operating voltage and power consumption and can be easily processed to produce large area displays. On a practical level, there is a need to produce OLEDs which are bright and operate efficiently but which are also reliable to produce and stable in use.

OLEDs may also be used in lighting applications, such as backlights for flat panel displays. Here, there is particular interest in producing OLEDs which emit white light. White light is defined as the radiation emitted by a black body at 3000-9000K. However, whilst proposals have been made to fabricate OLEDs capable of producing light with CIE coordinates approximating to white, the present applicants are not aware of such OLEDs being successfully fabricated for practical use.

U.S. Pat. No. 5,807,627 describes early work on electroluminescent devices having multiple layers. Devices exemplified in U.S. Pat. No. 5,807,627 incorporate polyarylene vinylene polymers such as poly(p-phenylene vinylene), PPV. During fabrication of the devices, these polyarylene vinylenes are laid down as a precursor polymer and subsequently converted by heat treatment into a functional semiconductive polymer. In the examples the precursor polymers are insoluble in chloroform, but soluble in methanol. An additional polymer layer such as poly(2-methoxy-5-(2-ethyl hexyloxy)1,4-phenylene vinylene), MEHPPV, is insoluble in methanol but soluble in chloroform and may be laid down by spin coating.

The device configurations described in U.S. Pat. No. 5,807,627 show colours of emission from red to yellow/green. No examples of white light emission were demonstrated. The exemplified devices were found to have very short lifetimes and relatively low quantum efficiencies.

U.S. Pat. No. 5,683,823 is concerned with an electroluminescent device having a fluorescent emitting layer including a red emitting material dispersed in host material that emits in the blue green regions so that the light produced is said to be substantially white.

U.S. Pat. No. 6,127,693 is said to provide a light-emitting diode (LED) which can emit near white light. The organic light-emitting layer of the device contains a blend of a blue light emitting poly(paraphenylene vinylene) and a red light emitting alkoxy substituted PPV derivative such that the LED can emit near white light.

Chen et al in Polymer Preprints, 41, 835 (2000) describes light emitting diodes which are purported to emit white light. Double-layer devices are described which include a doped blue-green polymer layer adjacent a cross-linked hole transport layer which emits in red by charge trapping. The blue/green layer consists of 9,9-bis(2'-ethyl hexyl)-polyfluorene (DEHF) which is doped with a green fluorescent dye pyrromethene 546 (Py546). The presence of the green dopant dye is required to achieve the white emission reported as a combination of three distinct emissions in blue, green and red. The emissions do not arise from recombination in, and radiative decay of excitons from, each of the three colour sources. The red emission of the cross-linked hole transport layer (x-HTPA) is attributed to aggregation within the crosslinked film. The maximum external quantum efficiency is reported to range only from 0.10% to 0.25%, which may be a consequence of this aggregation. Moreover, aggregation as described in Chen et al can not be controlled to an extent that would enable tuning of the colour of red emission.

EP 1434284 is concerned with white light-emitting organic electroluminescent devices. The devices include at least two organic electroluminescent (EL) materials and at least one photoluminescent (PL) material. In paragraph [0043] the combination of blue and red EL materials and a green PL material is disclosed to produce white light.

Accordingly, a need exists for an organic light emissive device which is sufficiently stable and operates at a level of efficiency suitable for practical use as a white light source for lighting applications.

In a first aspect, the present invention provides an organic light emissive device, which comprises:
  an anode;
  a cathode; and
  an organic light emissive region between the anode and the cathode, which region comprises:
  a layer of blue light electroluminescent organic material which emits light having first CIE co-ordinates by exciton radiative decay; and
  a layer of longer wavelength electroluminescent organic material which intrinsically emits light having second CIE co-ordinates by exciton radiative decay;
  wherein the layers of blue light and longer wavelength materials are selected so that the organic light emissive region emits white light falling within a region having a CIE x coordinate equivalent to that emitted by a black body at 3000-9000K and CIE y coordinate within 0.05 of the CIE y co-ordinate of said light emitted by a black body.

White light preferably has CIE coordinates around (0.31, 0.33). In one particularly preferred embodiment, the white light emission consists essentially of a mixture of the light having the first CIE co-ordinates and the light having the second CIE co-ordinates. In particular, it is preferred that the blue light electroluminescent material is not doped with an emissive dopant. In this case, it will be understood by the skilled person that a straight line drawn between the first and second CIE co-ordinates will pass through the region of white light.

In another embodiment, the white light emission consists essentially of a mixture of the light having the first CIE co-ordinates, the light having the second CIE co-ordinates and a light having third CIE co-ordinates. Preferably, the third CIE co-ordinates lie spectrally between the first and second CIE co-ordinates. The third CIE co-ordinate may be provided by a luminescent dopant provided in the blue light organic electroluminescent material. In this case, it will be understood by the skilled person that a region defined by a triangle drawn between the first, second and third CIE co-ordinates will overlap with the region of white light.

By "red light electroluminescent material" is meant an organic material that by electroluminescence emits radiation having a wavelength in the range of 600-750 nm, preferably 600-700 nm, more preferably 610-650 nm and most preferably having an emission peak around 650-660 nm. "Red light" preferably has CIE coordinates in the range x>0.3, y>0.3.

By "green light electroluminescent material" is meant an organic material that by electroluminescence emits radiation having a wavelength in the range of 510-580 nm, preferably 510-570 nm. "Red light" preferably has CIE coordinates in the range x>0.25, y>0.3.

By "blue light electroluminescent material" is meant an organic material that by electroluminescence emits radiation having a wavelength in the range of 400-500 nm, more preferably 430-500 nm.

Preferably, the layer of blue light electroluminescent material emits light having a CIE x co-ordinate less than or equal to 0.25, more preferably less than or equal to 0.2, and a CIE y co-ordinate less than or equal to 0.3, more preferably less than or equal to 0.2.

The choice of CIE x and y coordinate for the blue light electroluminescent material is generally dependent upon the choice of the CIE x and y coordinates of the longer wavelength electroluminescent material. For example, a red light electroluminescent material having CIE coordinates (0.65, 0.40) may require a blue light electroluminescent material having a CIE y coordinate greater than 0.3, for example 0.32. Such a CIE y coordinate moves the blue light electroluminescent material towards a cyan colour. As mentioned above, it will be understood by the skilled person that the coordinates are selected such that a straight line drawn between the sets of CIE co-ordinates will pass through the region of white light.

Preferably, at least one of the blue light electroluminescent organic material and the longer wavelength electroluminescent organic material is a polymer, more preferably a conjugated polymer. Most preferably, both materials are conjugated polymers.

It has surprisingly been found that an organic light emissive device may be fabricated which emits white light in a manner which is stable and which has a relatively high external quantum efficiency. Each of the layers of electroluminescent material contributing to the emission of white light by the organic light emissive region does so by exciton radiative decay upon charge carrier injection.

Preferred longer wavelength polymers include polymers comprising an optionally substituted repeat unit of formula (I):

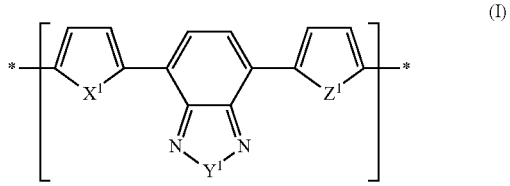

wherein $X^1$, $Y^1$ and $Z^1$ are each independently O, S, $CR_2$, $SiR_2$ or NR, more preferably O or S, most preferably S; and each R is independently alkyl, aryl or H. A preferred substituent for the repeat unit of formula (I) is $C_{1-20}$ alkyl which may be present on one or more of the rings of the repeat unit of formula (I).

More preferably, the longer wavelength polymer is a copolymer comprising an optionally substituted repeat unit of formula (I) and an arylene co-repeat unit selected from optionally substituted 1,4-phenylene repeat units as disclosed in J. Appl. Phys. 1996, 79, 934; fluorene repeat units as disclosed in EP 0842208; indenofluorene repeat units as disclosed in, for example, Macromolecules 2000, 33(6), 2016-2020; and spirofluorene repeat units as disclosed in, for example EP 0707020. Examples of substituents include solubilising groups such as $C_{1-20}$ alkyl or alkoxy; electron withdrawing groups such as fluorine, nitro or cyano; and substituents for increasing glass transition temperature (Tg) of the polymer.

Particularly preferred arylene repeat units comprise optionally substituted, 2,7-linked fluorenes, most preferably repeat units of formula II:

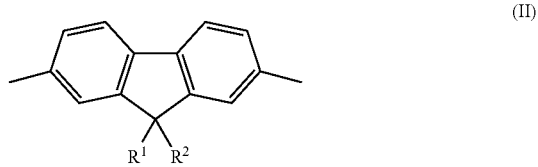

wherein $R^1$ and $R^2$ are independently selected from hydrogen or optionally substituted alkyl, alkoxy, aryl, arylalkyl, heteroaryl and heteroarylalkyl. More preferably, at least one of $R^1$ and $R^2$ comprises an optionally substituted $C_4$-$C_{20}$ alkyl or aryl group.

These copolymers are intrinsic longer wavelength electroluminescent organic materials, i.e. their electroluminescence spectrum (measured in the solid state) remains substantially the same as their photoluminescence spectrum (measured in solution), unlike the prior art triarylamine homopolymer which emits blue light by photoluminescence but which emits red light by electroluminescence, apparently as a consequence of aggregation in the solid state. Use of an intrinsic longer wavelength electroluminescent organic material allows control of its colour of emission by appropriate selection of repeat units and/or layer thickness, unlike the prior art system of a non-aggregated triarylamine homopolymer.

Other preferred materials include those manufactured by Merck OLED Materials GmbH and sold under the names "Super Yellow and Super Orange".

The longer wavelength electroluminescent organic material may or may not be crosslinked. Preferably, it is substantially without cross-linking.

The longer wavelength electroluminescent polymer is preferably formed by deposition from solution followed by heat treatment in order to render it substantially insoluble in the solvent used for deposition for the blue organic electroluminescent material, as described in further detail below. In this way, cross-linking of the polymer may be avoided.

Generally, the layer of longer wavelength electroluminescent organic material has a thickness in the range of 5 to 50 nm, preferably 10 to 20 nm. Useful devices may be fabricated in which this layer has a thickness of approximately 10 nm.

The blue light electroluminescent material is preferably a semiconductive polymer and may comprise a triarylamine repeat unit. Particularly preferred triarylamine repeat units are shown in formulae 1-6:

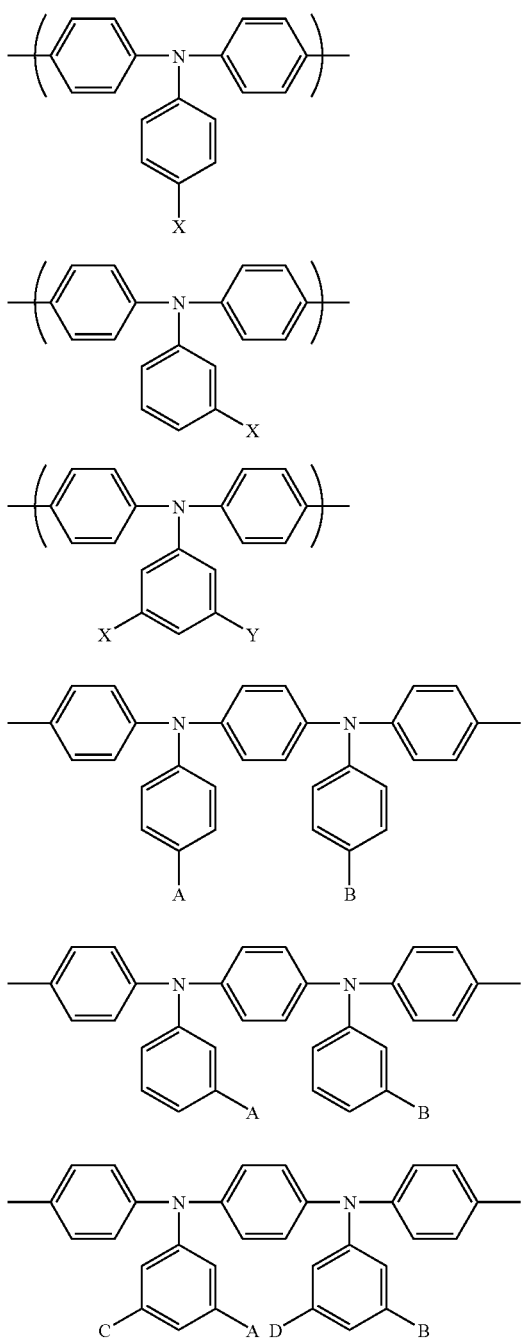

wherein X, Y, A, B, C and D are independently selected from H or a substituent group. More preferably, one or more of X, Y, A, B, C and D is independently selected from the group consisting of optionally substituted, branched or linear alkyl, aryl, perfluoroalkyl, thioalkyl, cyano, alkoxy, heteroaryl, alkylaryl and arylalkyl groups. Most preferably, X, Y, A and B are $C_{1-10}$ alkyl. The repeat unit of formula 4 is most preferred. Any two phenyl groups of repeat units 1-6 may be linked by a direct bond or by a divalent moiety, preferably a heteratom, more preferably O or S. In the case where units are linked, linkage of phenyl repeat units in the polymer backbones of units 1-3 is most preferred.

More preferably, the blue electroluminescent polymer is a copolymer, in particular an intrinsic blue electroluminescent copolymer, comprising one or more repeat units of formulae 1-6, most preferably a repeat unit of formula 4, and at least one arylene repeat unit. Particularly preferred arylene repeat units are as described above with respect to the longer wavelength emitter. It is preferred that each of the electroluminescent materials comprises a solution processible polymer. This provides for simpler and cheaper fabrication of the device as compared to devices formed by non-solution processing techniques such as vacuum evaporation.

In a preferred arrangement, the layer of longer wavelength electroluminescent polymer is positioned between the anode and the layer of blue light electroluminescent material. Because the layer of longer wavelength has a smaller bandgap than the blue light electroluminescent material, it does not block movement of excitons or electrons from the layer of blue light electroluminescent material. In order to facilitate hole transport into the layer of blue organic electroluminescent material, it is preferred that, the longer wavelength electroluminescent polymer comprises one or more hole transporting triarylamine repeat units selected from formulae 1-6 above, more preferably a repeat unit of formula 1.

The device may incorporate further layers in addition to those described above. For example, a hole transporting layer may advantageously be positioned between the anode and the organic light emissive region so as to facilitate movement of holes from the anode to the emissive materials. Such hole transporting layers include PEDT/PSS as disclosed in EP0901176 and EP0947123, or polyarylenes as disclosed in U.S. Pat. No. 5,723,873 and U.S. Pat. No. 5,798,170. PEDT/PSS is polystyrene sulfonic acid doped polyethylene dioxythiophene. Other hole transporting materials include PPV and poly(2,7-(9,9-di-n-octyl fluorene)-(1,4-phenylene-(4-imino(benzoic acid))-1,4-phenylene)) (BFA).

An electron-transporting material may be positioned between the cathode and the blue light emitting material.

The anode may be constructed of any conventional material and typically includes tin oxide, high work function metals such as gold or platinum and indium tin oxide (ITO). Indium tin oxide is preferred.

The cathode may also be constructed of any conventional material and may be a composite cathode. A typical cathode useful in the present invention is a lithium fluoride/calcium/aluminium cathode.

According to a second aspect of the present invention, there is provided a process for the production of an organic light emissive device, which process comprises:

providing an anode;
optionally forming a hole-transporting layer over the anode;
depositing over the anode or hole-transporting layer a layer of a first electroluminescent organic material which intrinsically emits light at a first wavelength;
depositing a layer of a second electroluminescent organic material over the layer of the first electroluminescent organic material; and
providing a cathode;
whereby an organic light emissive region is formed between the cathode and the anode which comprises a layer of blue light electroluminescent organic material and a layer of longer wavelength electroluminescent organic material;
wherein the layers of blue light and longer wavelength materials are selected so that the organic light emissive region emits white light falling within a region having a CIE x coordinate equivalent to that emitted by a black body at 3000-9000K and a CIE y coordinate within 0.05 of the CIE y co-ordinate of said light emitted by a black body.

In the process of the invention the first electroluminescent organic material that is deposited over the anode or, where a hole-transporting layer is formed over the anode, over the hole-transporting layer, is either a layer of the longer wavelength electroluminescent organic material or a layer of the blue light electroluminescent organic material. However, it is preferred that the first electroluminescent organic material is the longer wavelength electroluminescent organic material.

Advantageously, the layer of the first electroluminescent organic material is deposited from solution and is heated. The layer of the second organic material is then deposited from a solvent in which the first electroluminescent organic material is soluble. Preferably either, and more preferably both organic materials are polymers.

According to this process an "interlayer" is formed which is preferably the layer of the longer wavelength electroluminescent polymer. Suitably, this step of interlayer deposition is carried out by heating the deposited layer to form a heated layer preferably substantially in the absence of crosslinking.

Interlayer deposition in accordance with the present invention enables the formation of an emissive layer adjacent a further layer of emissive material so that the emissions from the two layers in combination in the organic light emissive region provide white light. This is made possible using the interlayer deposition technique even though the longer wavelength electroluminescent polymer and the blue light electroluminescent polymer may both be soluble in a common solvent.

According to embodiments of the present invention, the thickness of the interlayer can be used to tune emission to obtain a colour as close to white as possible.

The process according to the invention may be used in the production of a backlight for a flat panel display as well as for other lighting applications, in particular a source of ambient lighting.

According to a third aspect of the present invention, a solution suitable for deposition of both the blue light electroluminescent material and the longer wavelength electroluminescent material is provided. Accordingly, the solution comprises a first emissive material together with at least a second emissive material in a suitable solvent or mixture of solvents. One or both emissive materials may also perform the function of a charge transport material such as a hole transport material.

By appropriate selection of one or both of the emissive materials, it has been found that after deposition, the first and second emissive materials phase separate to form two layers of the device. In the case that one of the emissive materials also functions as a hole transport material, the hole transport material will phase separate to form a hole transport layer and the at least one other emissive material will form another layer on the hole transport layer.

Typically, the solution comprising the first and second emissive materials is deposited onto a conducting layer comprising a conducting material. In this case, one of the first and second emissive materials typically comprises a polar substituent group to aid phase separation.

Preferably, the first emissive material is the blue light electroluminescent material and is selected from a hole transport material in order to form a hole transport layer. In such a case, the second emissive material is the longer wavelength electroluminescent material and forms a layer upon the hole transport layer.

Alternatively, the first emissive material is the longer wavelength electroluminescent material and is selected from a hole transport material in order to form a hole transport layer. In such a case, the second emissive material is the blue light electroluminescent material and forms a layer upon the hole transport layer.

For optimising solution processing, particularly ink jet printing, a mixture of solvents may be present in the aforementioned solution.

It will be appreciated that it is necessary in the third aspect for the first and the at least second emissive material to be soluble in a common solvent. Preferably, a non-polar solvent is used and it is therefore preferred that the aforementioned polar substituent group, when present, is a neutral polar substituent group present in sufficiently low concentration to solubilise the material it is bound to in a polar solvent without rendering this material insoluble in non-polar solvents. In contrast, a charged polar substituent group is likely to render the material insoluble in non-polar solvents even at relatively low concentrations.

It will be understood that in order to achieve phase separation, the first emissive material should have an affinity for the material of the underlying layer, such as a layer comprising a conducting material, and the at least second emissive material should have no affinity or a weaker affinity for the material of the underlying layer. To this end, when the material of the underlying layer (e.g. conducting material) contains an acid, the first emissive material preferably contains polar substituent groups and the polar substituent groups preferably react with the underlying material to form the conjugate base of the acid.

The conducting material may comprise an organic conducting material, for example an organic hole injection material as defined anywhere herein.

It has been found that, in one embodiment, the first emissive material has an affinity for the conducting material when the conducting material contains polar groups and the first emissive material contains polar substituent groups.

Preferred neutral polar substituent groups independently can be selected from aliphatic or alicyclic oxygen-, nitrogen-, sulphur- and phosphorous-containing groups known in the art. For example oxygen-containing groups include ether (particularly polyether), ester and aldehyde (including polyaldehyde). Nitrogen-containing groups include amine (primary, secondary and tertiary), cyano, amide, and imine. Polyamines are preferred. Sulphur-containing groups include thiophene, thiol, and mercapto. Phosphorous-containing groups include phosphine and phosphazene. Preferred polar groups are amines, in particular cyclic amines, such as morpholine; and ethers comprising at least 3 oxygen atoms. Other preferred polar groups include non-conjugated pyridines, such as alkyl pyridines.

A neutral polar substituent group may become charged in situ, after deposition, thus becoming a charged polar substituent group.

The affinity may be optimised by selection of the number and location of the polar groups in the conducting material and the number and location of the polar substituent groups in the first emissive material. In this regard, when the first emissive material comprises a polymer, it is desirable for side chains or side groups pendant from the polymer backbone to comprise the polar substituent groups. Preferably, the side chains or side groups are not in conjugation with the polymer backbone. In this embodiment, the conducting material preferably comprises an organic conducting material, more preferably an organic conducting polymer, more preferably PEDT doped with a suitable charge balancing dopant. The charge balancing dopant may be acidic. The charge balancing dopant may be a polyanion. Preferably the charge balancing dopant comprises a sulfonic acid, such as poly(styrene sulfonate) (PSS) where the PEDT conducting polymer is blended with acidic polar PSS groups.

The first emissive material preferably comprises alkyl amine substituent groups, such as morpholine substituent groups, as discussed above.

In another embodiment, the surface of the underlying layer is treated prior to deposition of the solution comprising the first and the at least second emissive material in order to render the surface of the underlying layer hydrophobic such that deposition of a polymer blend according to the third aspect of the invention will phase separate with a non-polar material at the underlying layer surface. By this technique, a phase separated blend may be formed using a non-polar hole transporting first emissive material and a second emissive material comprising a polar substituent, for example morpholine. Any suitable known surface treatment may be used, for example treatment with chlorosilanes.

In this embodiment, the hole transport material may be any suitable material, particularly any material described herein, provided that it is capable of emitting light, preferably blue light. A preferred blue light emitting, hole transporting polymer has formula 100:

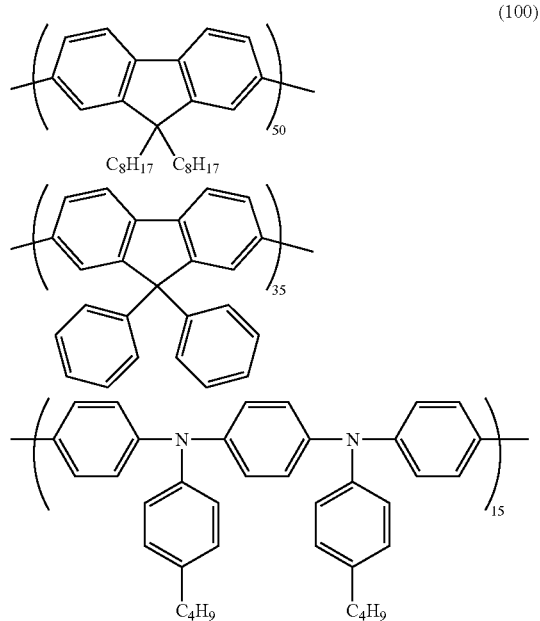

(100)

Any suitable emissive material may be used as the electroactive polymer in the second emissive layer.

The third aspect of the present invention further provides an organic electronic device obtained or obtainable by the method according to the third aspect of the present invention. As should be readily appreciated, the third aspect of the present invention provides a combined emission from the first and second emissive layers which can be considered as white light as described in accordance with the first and second aspects of the present invention.

In a first embodiment of the first, second or third aspects of the present invention, the longer wavelength electroluminescent material may emit a yellow light, a red light or a green light. For yellow CIE coordinates are around (0.45, 0.5) or preferably (0.5, 0.45).

In a second embodiment of the first, second or third aspects of the present invention, the longer wavelength electroluminescent material is a green light electroluminescent, preferably fluorescent, material that is capable of hole transport. In this second embodiment, the white light emission consists essentially of a mixture of the light having the first CIE co-ordinates, the light having the second CIE co-ordinates and a light having third CIE co-ordinates. The light having third CIE coordinates preferably is red light emitted from a red light electroluminescent, preferably fluorescent, material. Preferably, the red light electroluminescent material is a polymer. Preferably, the red light electroluminescent material is blended with the blue light electroluminescent material in a single layer. As such, preferably, the red light electroluminescent material and the blue light electroluminescent material are deposited together from a single solution. Preferred repeat units to be present in the red electroluminescent material in said single polymer are as disclosed anywhere herein. Preferred repeat units to be present in the blue light electroluminescent material in said single polymer are as defined anywhere herein in particular formulae 1 to 6 above.

The green light electroluminescent material preferably is a polymer, more preferably a conjugated polymer. Preferred repeat units to be present in the green light electroluminescent material in said polymer are as disclosed as herein, but for the exception of formula (I) described above. In this embodiment, it will be understood that the green light electroluminescent material is spatially separated from the blue (and red) light electroluminescent material(s). Surprisingly, by spatially separating the green emission from the blue (and red), the present inventors have found that decay of the green light electroluminescent material is significantly reduced. Thus, the device demonstrates reduced colour shift and longer lifetime as compared with a device using a red, green, blue tricomponent blend or a single electroluminescent polymer capable of simultaneously emitting red, green and blue light.

Preferred materials for the red, green and blue electroluminescent materials in relation to the second embodiment are as described anywhere herein.

The physical process in which white light is produced depends on the electronic properties of the green light electroluminescent material. Specifically, it depends on the LUMO level of the green with reference to that of the Blue/Red emitting layer:

Case 1) Green LUMO is shallower than blue and/or red LUMO.

Electrons will generally be confined to the layer comprising the blue light and red light electroluminescent materials. Green emission will come about through Forster transfer from the blue light electroluminescent materials to the green. The red emission will pass through the green layer unhindered. The resultant colour viewed will be a mix of red, green and blue, i.e. white.

Case 2) Green LUMO is deeper than blue and/or red LUMO.

Electrons and holes will be present in the green layer, and so green light predominantly will be emitted via recombination. The resultant colour viewed will be a mix of red, green and blue i.e. white.

In a third embodiment of the first, second and third aspects of the present invention, the longer wavelength electroluminescent material is a phosphorescent material, preferably a red light phosphorescent material In this third embodiment, the white light emission consists essentially of a mixture of the light having the first CIE co-ordinates, the light having the second CIE coordinates and a light having third CIE co-ordinates. The light having third CIE coordinates preferably is light emitted from an electroluminescent host material that is capable of transporting holes to the blue light electroluminescent material and is capable of transporting holes and electrons to the phosphorescent material. In this regard, the phosphorescent material is comprised as a dopant in the electroluminescent host material. As such, preferably the phosphorescent material and electroluminescent host material are deposited together from a single solution. The dopant phosphorescent material may be a separate material dispersed in the electroluminescent host material (i.e. a physical blend) or may be chemically bound to the electroluminescent host material, as described anywhere herein.

Where the longer wavelength electroluminescent material is a red light phosphorescent material and is spatially separated from the blue light electroluminescent material, the present inventors have found that this has the advantage of the phosphorescent material down converting some of the blue light to red light, thus producing an overall emission colour of white. Further, this has the advantage of a reduced colour shift with voltage as compared with a device using a red, blue bicomponent blend.

Preferred materials for the phosphorescent material, particularly the red light phosphorescent material, and blue light electroluminescent as discussed in relation to the third embodiment are as disclosed anywhere herein.

Referring to the electroluminescent host material, this preferably emits blue light. Suitable materials for the electroluminescent host material are as disclosed anywhere herein, and in particular as shown on formulae 1-6.

Preferably, when an electroluminescent material, particularly a red light electroluminescent material, is phosphorescent, it comprises a phosphorescent dendrimer comprising a core, and one or more conjugated dendrons comprising surface groups. However, this is not essential and a phosphorescent light electroluminescent material may comprise a. phosphorescent small molecule, for example a metal (M) surrounded by three bidentate ligands, or a phosphorescent linear polymer.

The solution processability of dend rimers is extremely adaptable as the surface groups that control the processing properties can be modified independently of the light emitting core.

A phosphorescent material, particularly a red light phosphorescent material, may comprise a metal complex. Preferred metal complexes comprise optionally substituted complexes of formula (7):

$$ML^1_qL^2_rL^3_s \quad (7)$$

wherein M is a metal; each of $L^1$, $L^2$ and $L^3$ is a coordinating group; q is an integer; r and s are each independently 0 or an integer; and the sum of (a. q)+(b. r)+(c.s) is equal to the number of coordination sites available on M, wherein a is the number of coordination sites on $L^1$, b is the number of coordination sites on $L^2$ and c is the number of coordination sites on $L^3$.

A red light phosphorescent material may have formula (8) or (9):

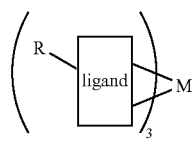

(8)

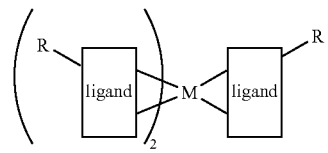

(9)

where M represents a metal and R represents H, a substituent group, or a dendron comprising a surface group.

When the red light phosphorescent material is a small molecule, R represents H or a substituent group. Examples of substituent groups include solubilising groups such as $C_{1-20}$-alkyl or alkoxy; electron withdrawing groups such as fluorine, nitro or cyano; and substituents for increasing glass transition temperature (Tg) of the polymer.

R may represent a dendron having a surface group such that the red emitting material is a dendrimer.

Preferably, the red phosphorescent dendrimer has formula (10) or (11):

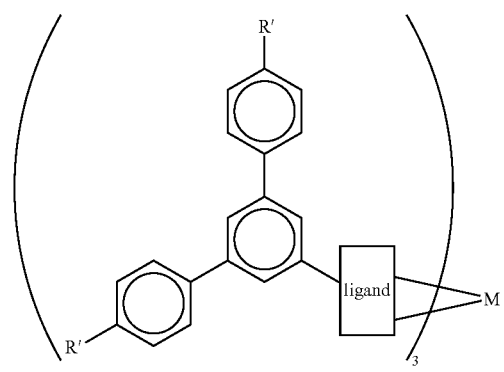

(10)

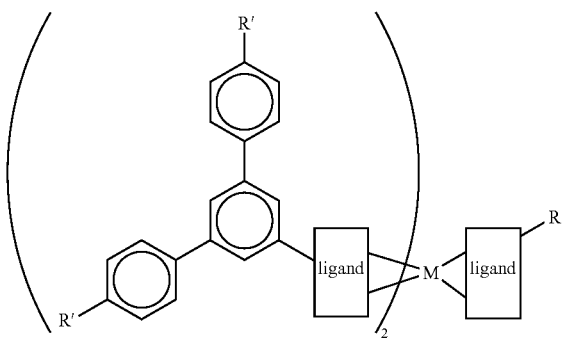

(11)

where M and R are as defined above and R' represents H or a surface group.

Examples of surface groups R' include solubilising groups such as $C_{1-20}$ alkyl or alkoxy; electron withdrawing groups such as fluorine, nitro or cyano; and substituents for increasing glass transition temperature (Tg) of the polymer.

Preferably, R' represents an alkyl or alkoxy group, preferably $C_1$ to $C_{20}$ alkyl or alkoxy, more preferably.

M may represent any suitable metal, in particular a d-block metal such as those in rows two and three i.e. elements 39 to 48 and 72 to 80, in particular ruthenium, rhodium, palladium, rhenium, osmium, iridium, platinum, tungsten and gold. Preferably, M represents iridium (Ir).

"Ligand" or "L" in formulae 7 to 11 may represent a carbon or nitrogen donor such as porphyrin or a bidentate ligand of formula (12):

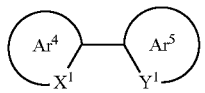

(12)

wherein $Ar^4$ and $Ar^5$ may be the same or different and are independently selected from optionally substituted aryl or heteroaryl; $X^1$ and $Y^1$ may be the same or different and are independently selected from carbon or nitrogen; and $Ar^4$ and $Ar^5$ may be fused together. Ligands wherein $X^1$ is carbon and $Y^1$ is nitrogen are particularly preferred.

Examples of bidentate ligands are illustrated below:

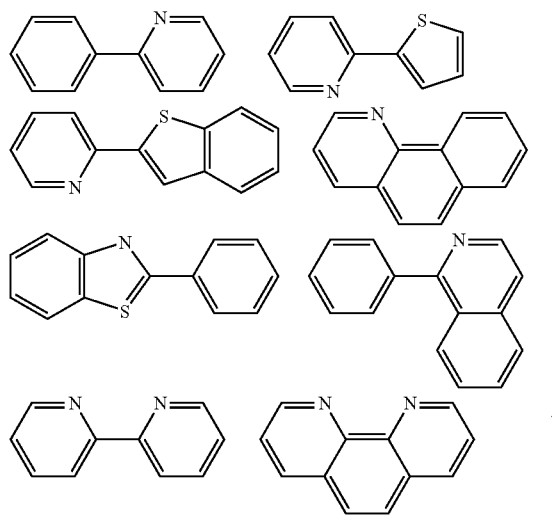

Each of $Ar^4$ and $Ar^5$ may carry one or more substituents. Particularly preferred substituents include fluorine or trifluoromethyl which may be used to blue-shift the emission of the complex as disclosed in WO 02/45466, WO 02/44189, US 2002-117662 and US 2002-182441; alkyl or alkoxy groups as disclosed in JP 2002-324679; carbazole which may be used to assist hole transport to the complex when used as an emissive material as disclosed in WO 02/81448; bromine, chlorine or iodine which can serve to functionalise the ligand for attachment of further groups as disclosed in WO 02/68435 and EP 1245659; and dendrons which may be used to obtain or enhance solution processability of the metal complex as disclosed in WO 02/66552.

Other ligands suitable for use with d-block elements include diketonates, in particular acetylacetonate (acac); triarylphosphines and pyridine, each of which may be substituted.

The red phosphorescent dendrimer may have formula (13) or (14):

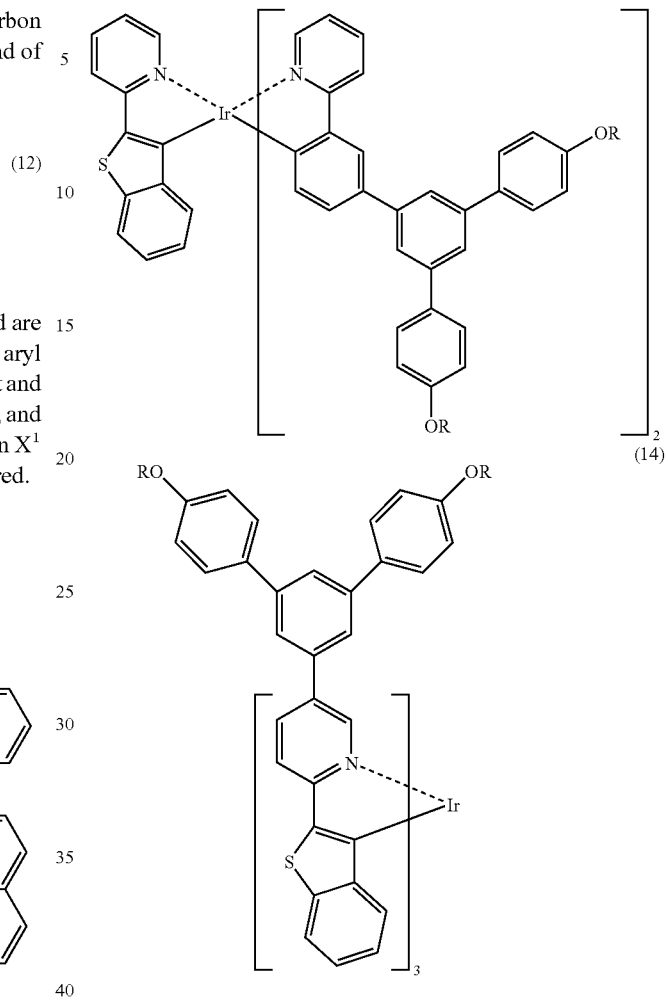

where R=2-ethyl,hexyl.

Any suitable host material may be used with the red light electroluminescent material. The host material may be a small molecule or a polymer. It is preferred that the host material is a polymer, more preferably a conjugated polymer.

The concentration of the red light electroluminescent material in the polymer host may be sufficient so that emission from the polymer host is not visible. The concentration of the red emitting material in the polymer host may be greater than 5 wt %, preferably greater than 7.5 wt %, more preferably greater than 10 wt %.

The concentration of the red light electroluminescent material in the polymer host may be sufficient so that emission from the polymer host is visible.

The host material and metal complex may be combined in the form of a physical blend. Alternatively, the metal complex may be chemically bound to the host material. In the case of a polymeric host, the metal complex may be chemically bound as a substituent attached to the polymer backbone, incorporated as a repeat unit in the polymer backbone or provided as an end-group of the polymer as disclosed in, for example, EP 1245659, WO 02/31896, WO 03/18653 and WO 03/22908.

Numerous hosts are described in the prior art including "small molecule" hosts such as 4,4'-bis(carbazol-9-yl)biphenyl), known as CBP, and (4,4',4"-tris(carbazol-9-yl)triphenylamine), known as TCTA, disclosed in Ikai et al. (Appl. Phys. Lett., 79 no. 2, 2001, 156); and triarylamines such as tris-4-(N-3-methylphenyl-N-phenyl)phenylamine, known as MTDATA. Homopolymers are also known as hosts, in particular polyvinyl carbazole) disclosed in, for example, Appl. Phys. Lett. 2000, 77(15), 2280; polyfluorenes in Synth. Met. 2001, 116, 379, Phys. Rev. B 2001, 63, 235206 and Appl. Phys. Lett. 2003, 82(7), 1006; poly[4-(N-4-vinylbenzyloxyethyl,N-methylamino)-N-(2,5-di-tert butylphenylnapthalimide] in Adv. Mater. 1999, 11 (4), 285; and poly(para-phenylenes) in J. Mater. Chem. 2003, 13, 50-55.

A range of blue light fluorescent materials are known in the art. The blue light fluorescent material may comprise a conjugated semiconductive polymer. The conjugated semiconductive polymer may be a copolymer comprising two or more different repeat units. The conjugated polymer may be a linear polymer or branched polymer. The conjugated polymer may comprise one or more different aryl or heteroaryl repeat units.

An example of a blue fluorescent polymer is a copolymer comprising an optionally substituted arylene or heteroarylene repeat unit, for example fluorene, indenofluorene or spirobifluorene, and an optionally substituted triarylamine repeat unit, for example a repeat unit of formula (15):

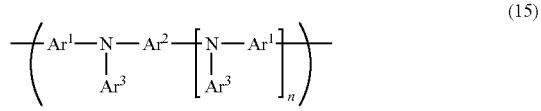

(15)

where n=0 or 1 and $Ar^1$, $Ar^2$ and $Ar^3$ each independently represent a substituted or unsubstituted aryl or heteroaryl group.

Preferably, $Ar^1$ is phenylene.
Preferably, n is 0.
Preferably, $Ar^2$ is 1,4-phenylene or 4,4'-biphenylene.
When n is 0, Ar is preferably 1,4-phenylene. When n is 1, $Ar^2$ is preferably 1,4-phenylene or 4,4'-biphenylene.
Preferably, $Ar^3$ is phenyl. $Ar^3$ may be substituted or unsubstituted; preferably $Ar^3$ is substituted with a solubilising group, more preferably optionally substituted $C_{1-20}$ alkyl or $C_{1-20}$ alkoxy.

Additional repeat units, such as hole or electron transporting repeat units, may also be present in the blue fluorescent polymer. Blue fluorescent polymers of this type are disclosed in, for example, WO 02/092723.

The fluorescent blue emitting material may comprise a metal complex.

The fluorescent blue emitting material may be a small molecule.

Green light electroluminescent materials also are known in the art.

A green light electroluminescent material may comprise a conjugated semiconductive polymer. The conjugated semiconductive polymer may be a copolymer comprising two or more different repeat units. The conjugated polymer may be a linear polymer or branched polymer. The polymer may be fluorescent. The conjugated polymer may comprise one or more different aryl or heteroaryl repeat units.

An example of a green fluorescent polymer is a copolymer comprising an optionally substituted arylene or heteroarylene repeat unit, for example fluorene, indenofluorene or spirobifluorene, and an optionally substituted 4,7-linked 2, 1, 3 benzothiadiazole repeat unit as disclosed in, for example, Macromolecules 2002, 35, 6094-6100. Additional repeat units, such as hole or electron transporting repeat units, may also be present in the green fluorescent polymer.

The green light electroluminescent may comprise a metal complex. The metal complex may be phosphorescent.

The green light electroluminescent material may be a small molecule.

Preferred green fluorescent, green phosphorescent, and blue fluorescent metal complexes comprise optionally substituted complexes of formula (7) as defined above. Green fluorescent, green phosphorescent, and blue fluorescent metal complexes may be obtained by appropriate selection of M, $L^1$, $L^2$ and $L^3$.

M may represent a heavy element. Heavy elements M induce strong spin-orbit coupling to allow rapid intersystem crossing and emission from triplet states (phosphorescence). Suitable heavy metals M include:

lanthanide metals such as cerium, samarium, europium, terbium, dysprosium, thulium, erbium and neodymium; and d-block metals, in particular those in rows 2 and 3 i.e. elements 39 to 48 and 72 to 80, in particular ruthenium, rhodium, palladium, rhenium, osmium, iridium, platinum and gold.

Suitable coordinating groups for the f-block metals include oxygen or nitrogen donor systems such as carboxylic acids, 1,3-diketonates, hydroxy carboxylic acids, Schiff bases including acyl phenols and iminoacyl groups. As is known, luminescent lanthanide metal complexes require sensitizing group(s) which have the triplet excited energy level higher than the first excited state of the metal ion. Emission is from an f-f transition of the metal and so the emission colour is determined by the choice of the metal. The sharp emission is generally narrow, resulting in a pure colour emission useful for display applications.

The d-block metals form organometallic complexes with carbon or nitrogen donors such as porphyrin or bidentate ligands of formula (12) as defined above.

Other ligands suitable for use with d-block elements include diketonates, in particular acetylacetonate (acac); triarylphosphines and pyridine, each of which may be substituted.

Main group metal complexes show ligand based, or charge transfer emission. For these complexes, the emission colour is determined by the choice of ligand as well as the metal.

The host material and metal complex may be combined in the form of a physical blend. Alternatively, the metal complex may be chemically bound to the host material. In the case of a polymeric host, the metal complex may be chemically bound as a substituent attached to the polymer backbone, incorporated as a repeat unit in the polymer backbone or provided as an end-group of the polymer as disclosed in, for example, EP 1245659, WO 02/31896, WO 03/18653 and WO 03/22908.

A wide range of fluorescent low molecular weight metal complexes are known and have been demonstrated in organic light emitting devices [see, e. g., Macromol. Sym. 125 (1997) 1-48, U.S. Pat. No. 5,150,006, U.S. Pat. No. 6,083,634 and U.S. Pat. No. 5,432,014], in particular tris-(8-hydroxyquinoline)aluminium. Suitable ligands for di or trivalent metals include: oxinoids, e.g. with oxygen-nitrogen or oxygen-oxygen donating atoms, generally a ring nitrogen atom with a substituent oxygen atom, or a substituent nitrogen atom or oxygen atom with a substituent oxygen atom such as 8-hydroxyquinolate and hydroxyquinoxalinol-10-hydroxybenzo (h) quinolinato (II), benzazoles (III), schiff bases, azoindoles, chromone derivatives, 3-hydroxyflavone, and carboxylic acids such as salicylate) amino carboxylates and ester carboxylates. Optional substituents include halogen, alkyl, alkoxy, haloalkyl, cyano, amino, amido, sulfonyl, carbonyl, aryl or heteroaryl on the (hetero) aromatic rings which may modify the emission colour.

The present invention will now be described in further detail, by way of example only, with reference to the accompanying drawings in which.

Figure 5:
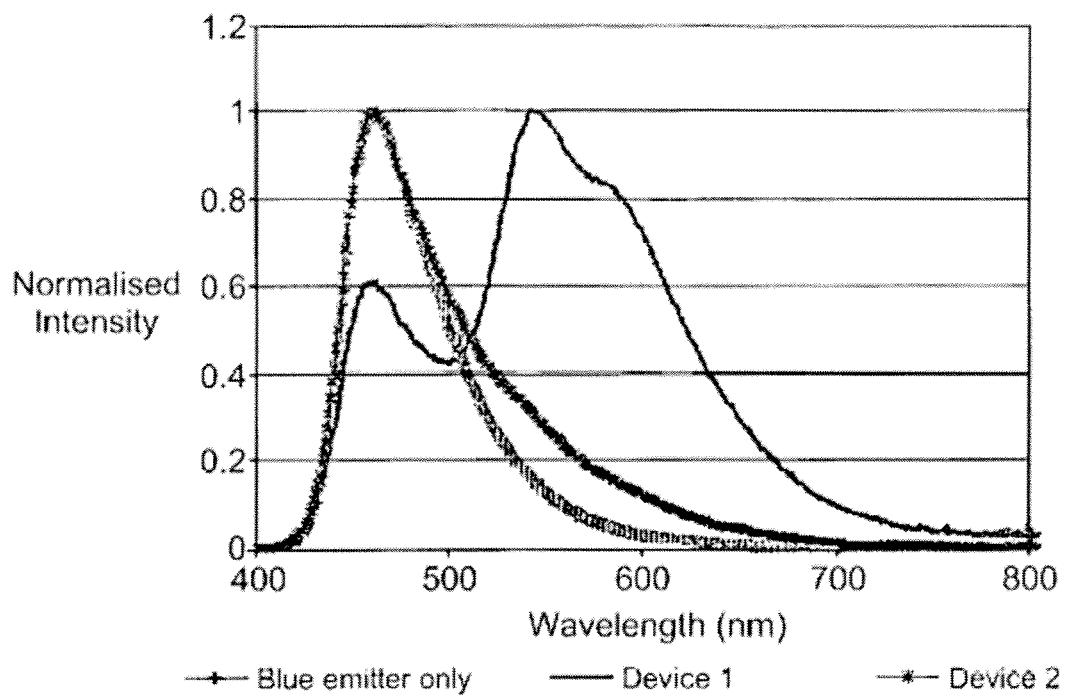
Figure 6:
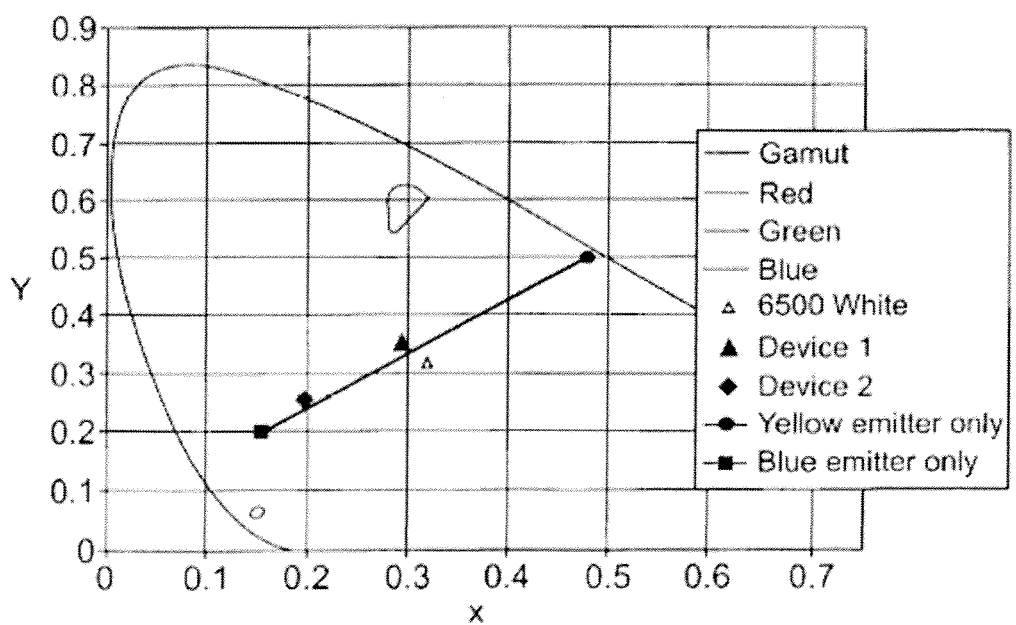
Figure 7:
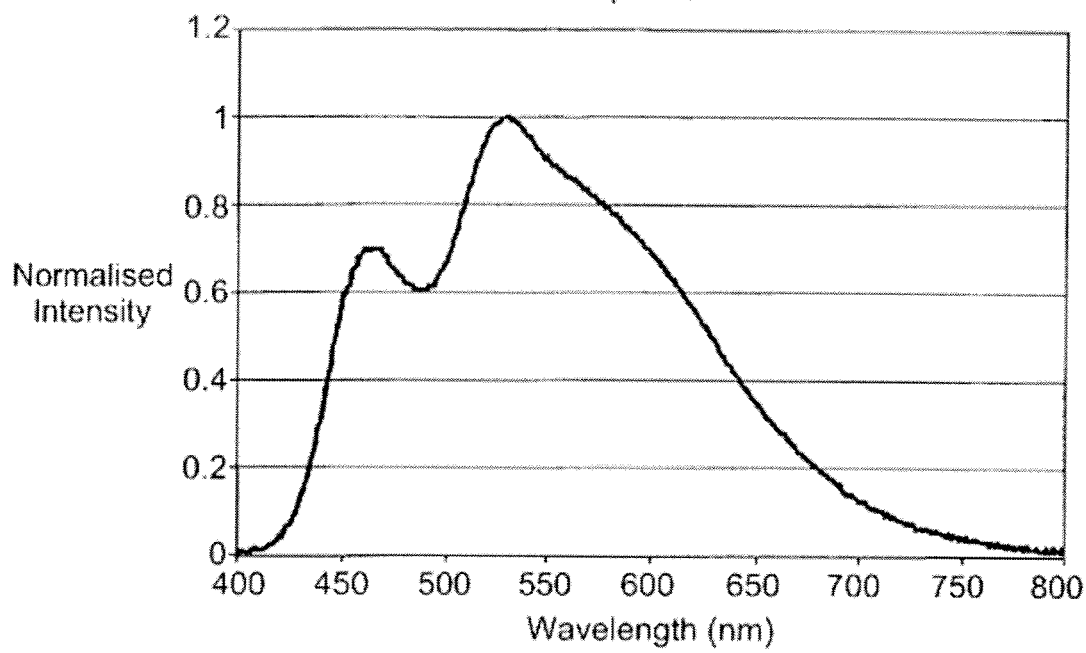
Figure 8:
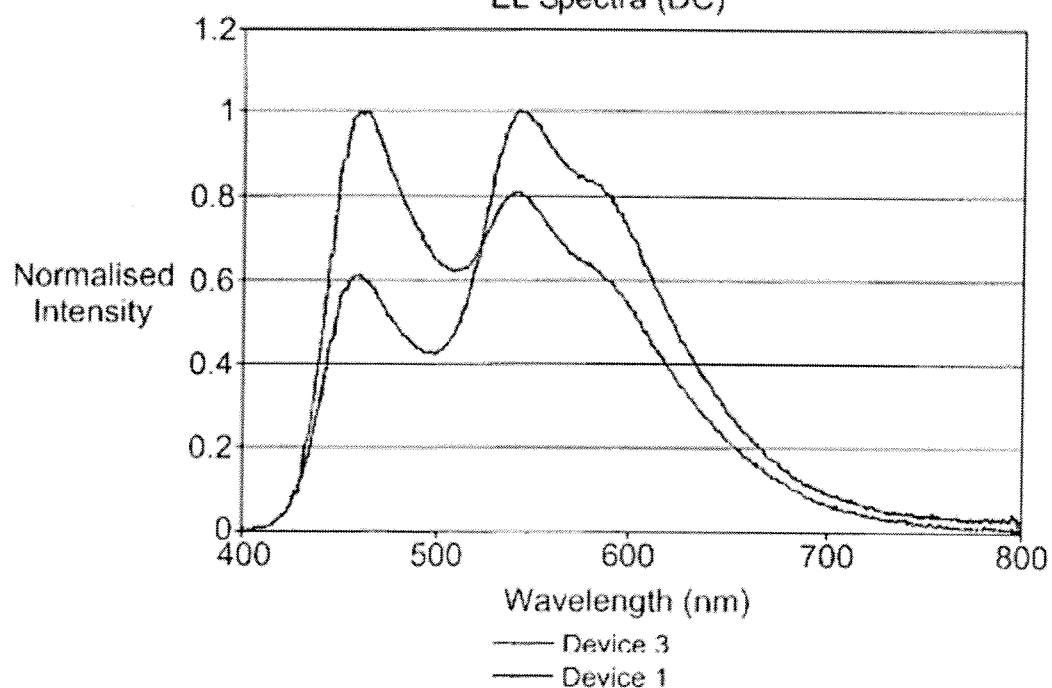
Figure 9:
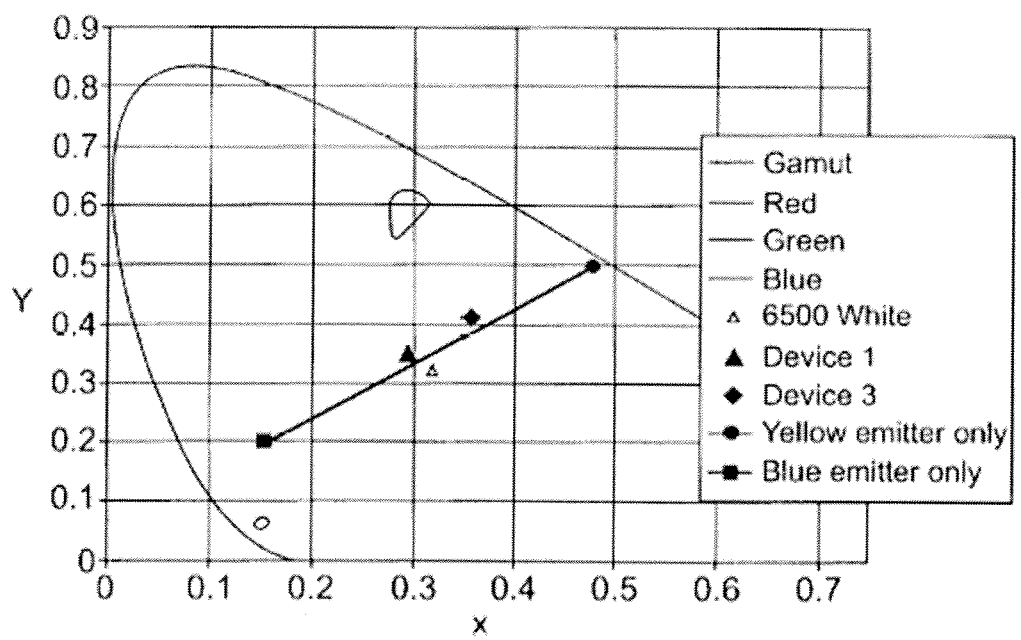

FIG. 5 shows electroluminescent emission spectra for both device 1 and 2 of example 2;

FIG. 6 shows a graph of CIE coordinates indicating where light emission for device 1 and 2 of example 2 occurs;

FIG. 7 shows an electroluminescent emission spectrum for the device structure of example 3;

FIG. 8 shows electroluminescent emission spectra for both device 1 and 3 of example 4; and FIG. 9 shows a graph of CIE coordinates indicating where light emission for device 1 and 3 of example 4 occurs.

Figure 1:
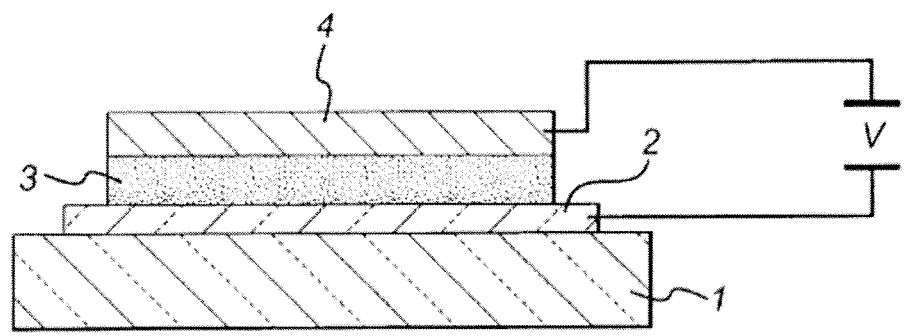
FIG. 1 shows in schematic form a typical cross-sectional structure of an OLED.
Figure 2:
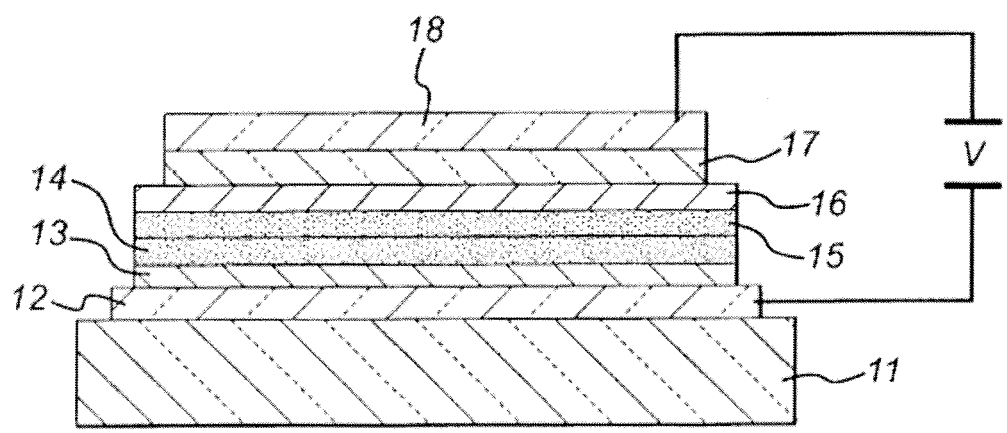
FIG. 2 shows in schematic form a cross-sectional structure of an OLED according to the invention.

With reference to FIG. 1, the architecture of an electroluminescent device according to the invention comprises a transparent glass or plastic substrate 1, an anode 2 of indium tin oxide and a cathode 4. An electroluminescent layer 3 is provided between anode 2 and cathode 4.

Further layers may be located between anode 2 and cathode 3, such as charge transporting, charge injecting or charge blocking layers.

In particular, it is desirable to provide a conductive hole injection layer formed of a doped organic material located between the anode 2 and the electroluminescent layer 3 to assist hole injection from the anode into the layer or layers of semiconducting polymer. Examples of doped organic hole injection materials include poly(ethylene dioxythiophene) (PEDT), in particular PEDT doped with polystyrene sulfonate (PSS) as disclosed in EP 0901176 and EP 0947123, or polyaniline as disclosed in U.S. Pat. No. 5,723,873 and U.S. Pat. No. 5,798,170.

If present, a hole transporting layer located between anode 2 and electroluminescent layer 3 preferably has a HOMO level of less than or equal to 5.5 eV, more preferably around 4.8-5.5 eV.

If present, an electron transporting layer located between electroluminescent layer 3 and cathode 4 preferably has a LUMO level of around 3-3.5 eV.

Electroluminescent layer 3 may consist of the electroluminescent material alone or may comprise the electroluminescent material in combination with one or more further materials. In particular, the electroluminescent material may be blended with hole and/or electron transporting materials as disclosed in, for example, WO 99/48160. Alternatively, the electroluminescent material may be covalently bound to a charge transporting material.

Of course, in accordance with the present invention, the electroluminescent layer must comprise at least the blue light electroluminescent organic material.

Suitable electroluminescent polymers for use in layer 3 include poly(arylene vinylenes) such as poly(p-phenylene vinylenes) and polyarylenes such as: polyfluorenes, particularly 2,7-linked 9,9 dialkyl polyfluorenes or 2,7-linked 9,9 diaryl polyfluorenes; polyspirofluorenes, particularly 2,7-linked poly-9,9-spirofluorene; polyindenofluorenes, particularly 2,7-linked polyindenofluorenes; polyphenylenes, particularly alkyl or alkoxy substituted poly-1,4-phenylene. Such polymers as disclosed in, for example, Adv. Mater. 2000 12(23) 1737-1750 and references therein.

Cathode 4 is selected from materials that have a workfunction allowing injection of electrons into the electroluminescent layer. Other factors influence the selection of the cathode such as the possibility of adverse interactions between the cathode and the electroluminescent material. The cathode may consist of a single material such as a layer of aluminium. Alternatively, it may comprise a plurality of metals, for example a bilayer of calcium and aluminium as disclosed in WO 98/10621, elemental barium disclosed in WO 98/57381, Appl. Phys. Lett. 2002, 81(4), 634 and WO 02/84759 or a thin layer of dielectric material to assist electron injection, for example lithium fluoride disclosed in WO 00/48258 or barium fluoride, disclosed in Appl. Phys. Lett. 2001, 79(5), 2001. In order to provide efficient injection of electrons into the device, the cathode preferably has a workfunction of less than 3.5 eV, more preferably less than 3.2 eV, most preferably less than 3 eV.

Optical devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

The device is preferably encapsulated with an encapsulant (not shown) to prevent ingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142. A getter material for absorption of any atmospheric moisture and/or oxygen that may permeate through the substrate or encapsulant may be disposed between the substrate and the encapsulant.

In a practical device, at least one of the electrodes is semi-transparent in order that light may be absorbed (in the case of a photoresponsive device) or emitted (in the case of an OLED). Where the anode is transparent, it typically comprises indium tin oxide. Examples of transparent cathodes are disclosed in, for example, GB 2348316.

The embodiment of FIG. 1 illustrates a device wherein the device is formed by firstly forming an anode on a substrate followed by deposition of an electroluminescent layer and a cathode, however it will be appreciated that devices of the invention could also be formed by firstly forming a cathode on a substrate followed by deposition of an electroluminescent layer and an anode.

Conjugated Polymers (Fluorescent and/or Charge Transporting)

Polymers preferably comprise a first repeat unit selected from arylene repeat units, in particular: 1,4-phenylene repeat units as disclosed in J. Appl. Phys. 1996, 79, 934; fluorene repeat units as disclosed in EP 0842208; indenofluorene repeat units as disclosed in, for example, Macromolecules 2000, 33(6), 2016-2020; and spirofluorene repeat units as disclosed in, for example EP 0707020. Each of these repeat units is optionally substituted. Examples of substituents include solubilising groups such as $C1_{-20}$ alkyl or alkoxy;

electron withdrawing groups such as fluorine, nitro or cyano; and substituents for increasing glass transition temperature (Tg) of the polymer.

Particularly preferred polymers comprise optionally substituted, 2,7-linked fluorenes, most preferably repeat units of formula (II).

A polymer comprising the first repeat unit may provide one or more of the functions of hole transport, electron transport and emission depending on which layer of the device it is used in and the nature of co-repeat units.

In particular:
- a homopolymer of the first repeat unit, such as a homopolymer of 9,9-dialkylfluoren-2,7-diyl, may be utilised to provide electron transport.
- a copolymer comprising a first repeat unit and a triarylamine repeat unit, in particular a repeat unit selected from formulae 1-6, may be utilised to provide hole transport and/or emission.

Particularly preferred hole transporting polymers of this type are AB copolymers of the first repeat unit and a triarylamine repeat unit.

- a copolymer comprising a first repeat unit and heteroarylene repeat unit may be utilised for charge transport or emission. Preferred heteroarylene repeat units are selected from formulae 37 to 51:

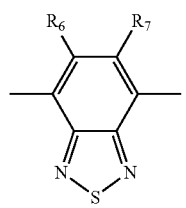

37 wherein $R_6$ and $R_7$ are the same or different and are each independently hydrogen or a substituent group, preferably alkyl, aryl, perfluoroalkyl, thioalkyl, cyano, alkoxy, heteroaryl, alkylaryl or arylalkyl. For ease of manufacture, $R_6$ and $R_7$ are preferably the same. More preferably, they are the same and are each a phenyl group.

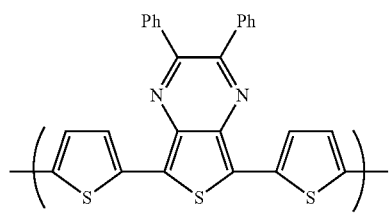

38

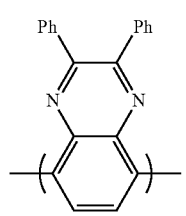

39

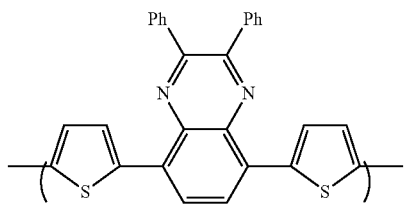

40

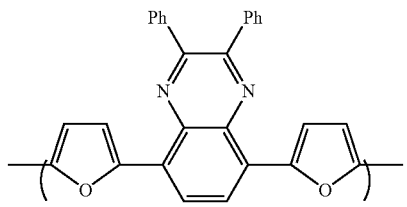

41

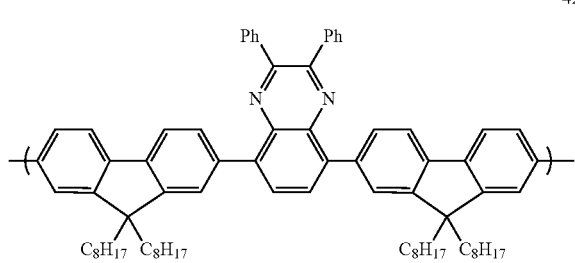

42

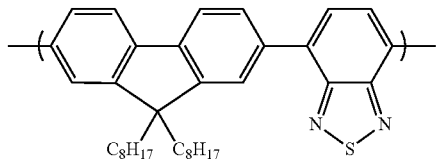

43

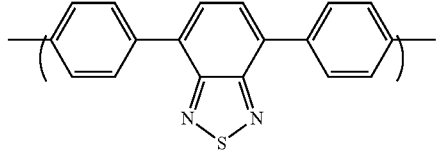

44

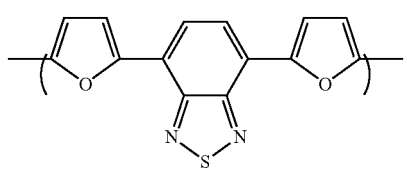

45

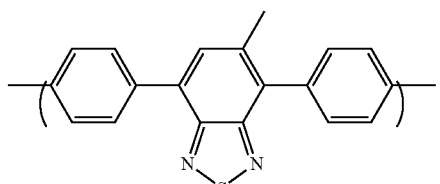

46

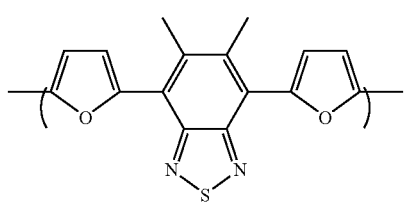

47

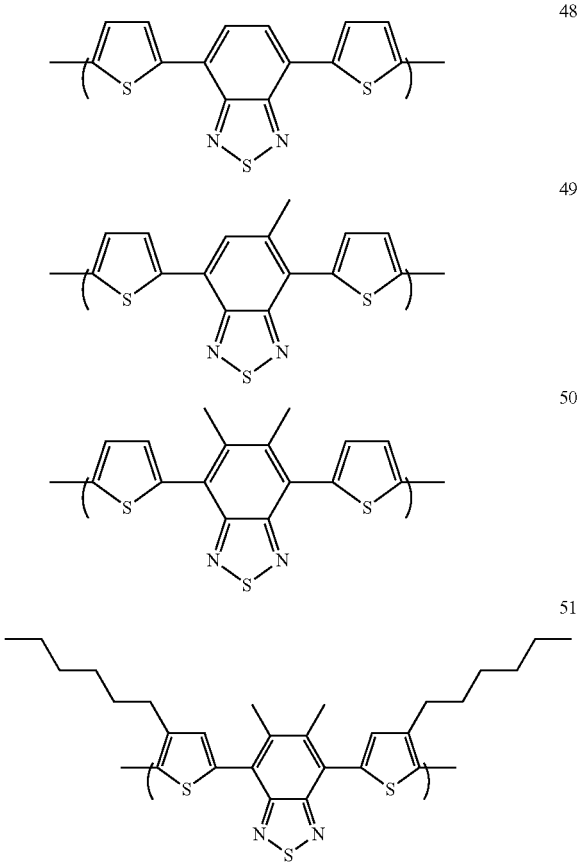

Electroluminescent copolymers may comprise an electroluminescent region and at least one of a hole transporting region and an electron transporting region as disclosed in, for example, WO 00/55927 and U.S. Pat. No. 6,353,083. If only one of a hole transporting region and electron transporting region is provided then the electroluminescent region may also provide the other of hole transport and electron transport functionality. However, if two electroluminescent regions are provided, one may provide the functionality of a hole transport layer and the other the function of an electron transport layer.

The different regions within such a polymer may be provided along the polymer backbone, as per U.S. Pat. No. 6,353,083, or as groups pendant from the polymer backbone as per WO 01/62869.

Polymerisation methods

Preferred methods for preparation of these polymers are Suzuki polymerisation as described in, for example, WO 00/53656 and Yamamoto polymerisation as described in, for example, T. Yamamoto, "Electrically Conducting And Thermally Stable pi-conjugated Poly(arylene)s Prepared by Organometallic Processes", Progress in Polymer Science 1993, 17, 1153-1205. These polymerisation techniques both operate via a "metal insertion" wherein the metal atom of a metal complex catalyst is inserted between an aryl group and a leaving group of a monomer. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units and end groups comprising aryl groups as illustrated throughout this application may be derived from a monomer carrying a suitable leaving group.

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

As alternatives to halides, other leaving groups capable of participating in metal insertion include groups include tosylate, mesylate and triflate.

Solution Processing

A single polymer or a plurality of polymers may be deposited from solution to form a layer. Suitable solvents for polyarylenes, in particular polyfluorenes, include mono- or poly-alkylbenzenes such as toluene and xylene. Particularly preferred solution deposition techniques are spin-coating and inkjet printing.

Spin-coating is particularly suitable for devices wherein patterning of the electroluminescent material is unnecessary—for example for lighting applications or simple monochrome segmented displays.

InkJet printing is particularly suitable for high information content displays, in particular full colour displays. InkJet printing of OLEDs is described in, for example, EP 0880303.

If multiple layers of the device are formed by solution processing then the skilled person will be aware of techniques to prevent intermixing of adjacent layers, for example by cross-linking of one layer before deposition of a subsequent layer or selection of materials for adjacent layers such that the material from which the first of these layers is formed is not soluble in the solvent used to deposit the second layer. Other techniques to prevent intermixing include deposition of a layer from solution followed by heat treatment on order to render it substantially insoluble in the solvent used for deposition for the subsequent layer. In this way, cross-linking of the layers can be avoided.

EXAMPLE 1

According to this Example a device having the structure: indium tin oxide/PEDOT/red interlayer/blue layer/UF/Ca/Al was fabricated and tested.

A 65 nm layer of PEDOT 13 is deposited by spin-coating formulation Baytron P (RTM) available from H C Starck of Leverkusen, Germany onto an indium tin oxide anode 12 supported on a glass substrate 11 (available from Applied Films, Colorado, USA). A layer of a thin film of electroluminescent organic material 14 is deposited over the PEDOT layer by spin-coating from solution. The organic material is a red-emissive polymer of formula (III) which is deposited by spin coating from xylene solution. Once deposited, this material is heated at a temperature of 180° C. for 1 hour. The thickness of this layer is 10 nm. Following cooling a 70 nm layer 15 of a blue electroluminescent polymer is deposited from solution over the heated layer of red polymer. The blue polymer has formula (IV) and is deposited by spin coating from xylene solution.

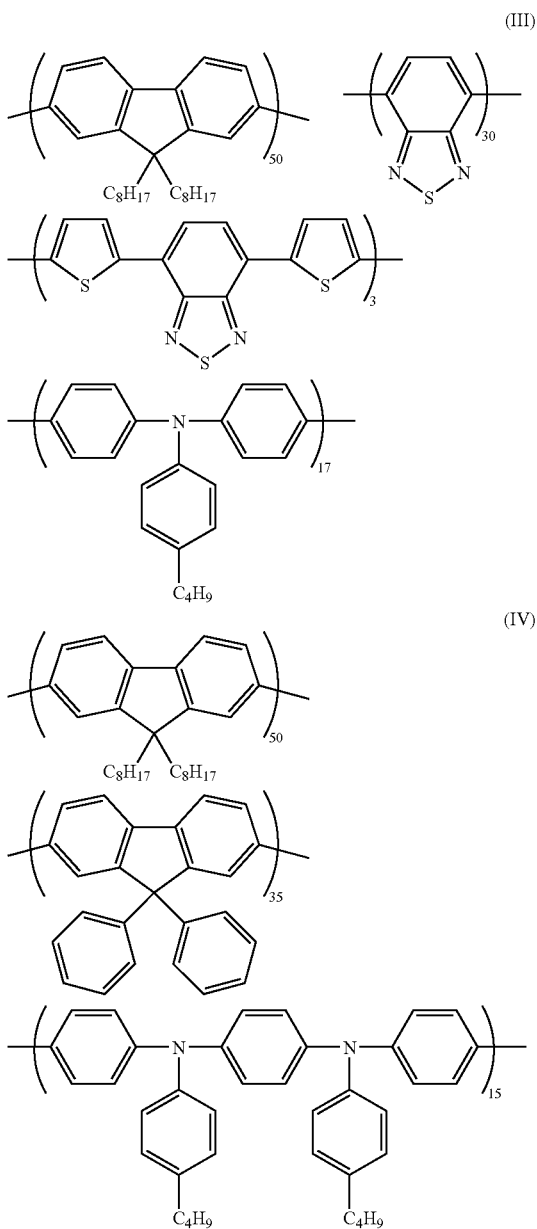

A layer of lithium fluoride 16 is deposited onto the blue light emissive layer at a thickness of about 4 nm, followed by a layer of calcium 17 to a thickness of about 10 nm, and finally a capping layer 18 of aluminium to a thickness of around 250 nm, all of which are applied by thermal evaporation. The device is then encapsulated using a metal enclosure available from Saes Getters Spa (not shown) that is glued to the substrate in order to form an airtight seal.

Figure 3:
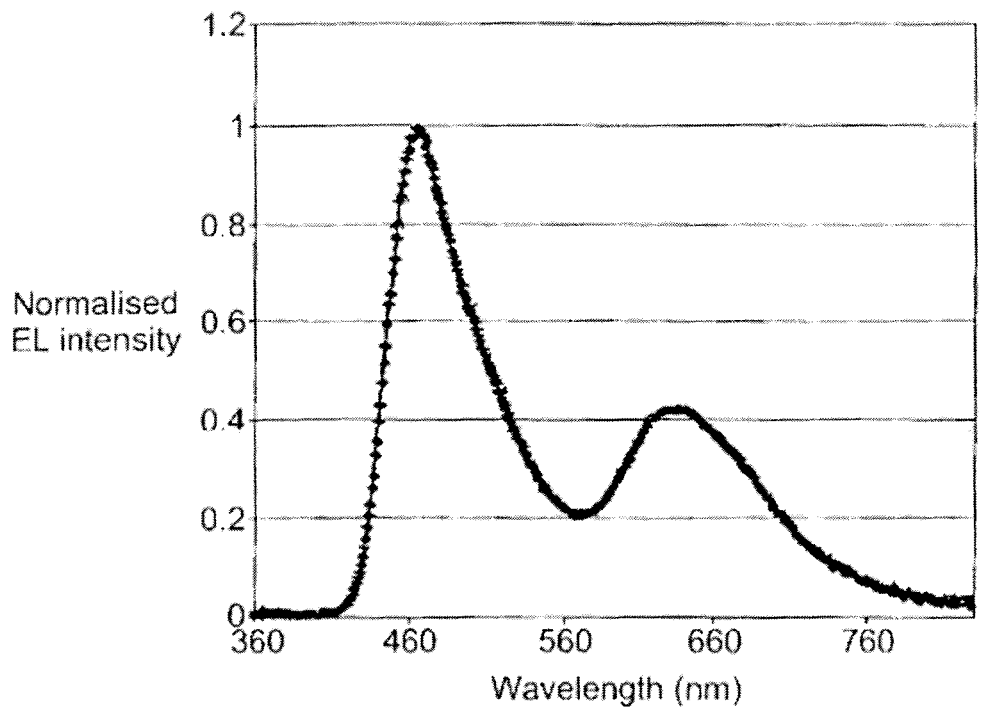
FIG. 3 shows a graph of normalised electroluminescent intensity against wavelength of emission from a device according to the invention.

An electroluminescent emission spectrum from the device structure is shown in FIG. 3 when the device is driven at a voltage providing 800 cd/m². It will be apparent from the emission spectrum that this is a composite of the emission spectra from the two individual layers of blue and red emitting materials. In operation, the red interlayer has a smaller bandgap than the blue emitter and so does not block excitons or electrons from the blue polymeric layer. Emission in each of these layers takes place by radiative exciton decay.

Figure 4:
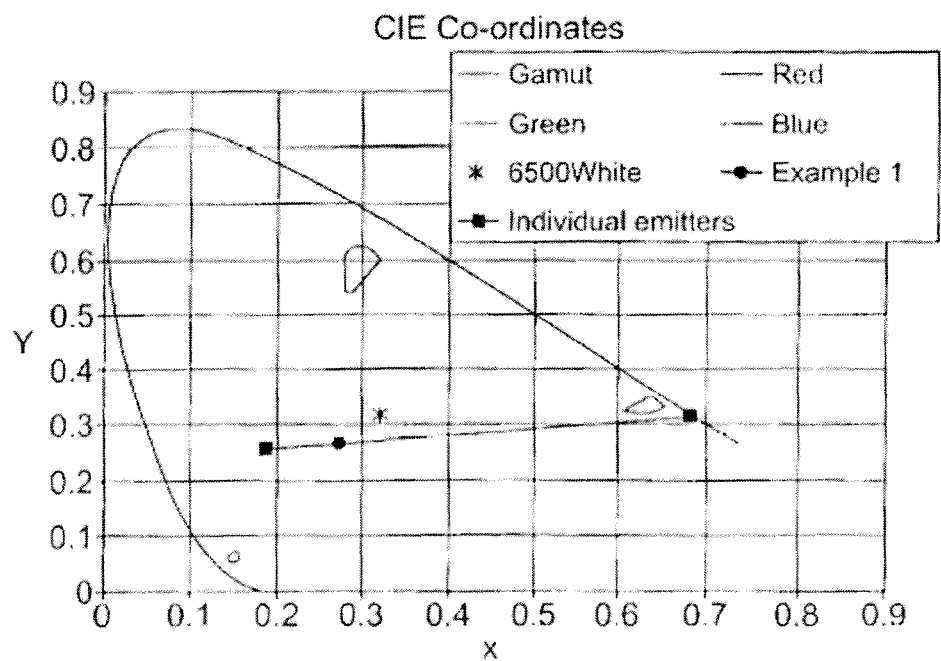
FIG. 4 shows a graph of CIE coordinates indicating where light emission from devices of the present invention occurs.

Referring to FIG. 4, the organic light emissive region of this device gives a colour slightly to the blue side of white emission. The colour lies along the line between the CIE coordinates of the red interlayer and the blue light emitting polymer. Other materials may be chosen to modulate the colour. For example, if a more yellow interlayer is chosen to be used with the blue polymer, a colour closer to white is obtainable.

The device of the Example is found to have an external quantum efficiency of up to 1.47% with a lifetime of 371 hours driven at 800 cd/m² with a turn up after one hour. The colour during the lifetime test was found to be substantially stable. Accordingly, the device efficiency and stability are high as compared with other known attempts to produce white light emission in OLEDs.

EXAMPLE 2

According to this Example a device having the structure: indium tin oxide/PEDOT/yellow interlayer/blue layer/Ba/Al was fabricated and tested.

A 65 nm layer of PEDOT 13 is deposited by spin-coating formulation Baytron P (RTM) available from H C Starck of Leverkusen, Germany onto an indium tin oxide anode 12 supported on a glass substrate 11 (available from Applied Films, Colorado, USA). A layer of a thin film of electroluminescent organic material 14 is deposited over the PEDOT layer by spin-coating from solution. The organic material is a yellow emissive polymer solution, purchased premixed from the supplier (Merck) and sold under the name "SuperYellow" and then diluted using toluene to the desired concentration. Once deposited, this material is heated at a temperature of 180° C. for 1 hour to form an interlayer. The thickness of the interlayer for this device (Device 1) was 10 nm. Another device (Device 2) was also made where the concentration of the yellow emissive polymer solution was reduced by a factor of 2. This layer was not measured exactly but was confirmed to be less than 10 nm, as expected from the reduced concentration. Following cooling a 65 nm layer 15 of a blue electroluminescent polymer is deposited from solution over the heated layers of yellow polymer for both Device 1 and Device 2.

For both devices, a layer of Barium 16 is deposited onto the blue light emissive layer at a thickness of about 5 nm followed by a capping layer 18 of aluminium to a thickness of around 250 nm, both of which are applied by thermal evaporation. The devices are then encapsulated using a metal enclosure available from Saes Getters SpA (not shown) that is glued to the substrate in order to form an airtight seal.

The electroluminescent emission spectra for both device structures are shown in FIG. 5 when the device is driven at a voltage providing 100 cd/m². It will be apparent from the emission spectra that this is a composite of the emission spectra from the two individual layers of blue and yellow emitting materials. In operation, the yellow interlayer has a smaller bandgap than the blue emitter and so does not block excitons or electrons from the blue polymeric layer. Emission in each of these layers takes place by radiative exciton decay. It is also apparent that in device 2 with the thinner interlayer, the level of yellow emission is reduced.

Referring to FIG. 6, the organic light emissive region for device 1 gives a colour close to white emission. The colour lies close to line between the CIE coordinates of the yellow interlayer and the blue light emitting polymer. For device 2 with the reduced thickness interlayer, the colour is shifted along this line towards the blue due to the reduced amount of yellow emission. This illustrates how the thickness of the interlayer can be used to further tune emission along the line to obtain a colour as close to white as possible.

Device 1 is found to have an external quantum efficiency of up to 2.7% with a lifetime of 350 hours driven at 1600 cd/m² with a turn up after one hour.

EXAMPLE 3

According to this Example a device having the structure: indium tin oxide/PEDOT/green interlayer/blue and red blended layer/Ba/Al was fabricated and tested.

A 65 nm layer of PEDOT 13 is deposited by spin-coating formulation Baytron P (RTM) available from H C Starck of Leverkusen, Germany onto an indium tin oxide anode 12 supported on a glass substrate 11 (available from Applied Films, Colorado, USA). A layer of a thin film of green electroluminescent organic material 14 comprising fluorene repeat units, 2,13-benzothiadiazole repeat units and triarylamine repeat units as disclosed in WO 00/46321 is deposited over the PEDOT layer by spin-coating from xylene solution. Once deposited, this material is heated at a temperature of 180° C. for 1 hour. The thickness of this layer is 10 nm. Following cooling a 70 nm layer 15 of a blend of a blue electroluminescent polymer as described in WO 03/095586 and a red electroluminescent polymer comprising 9,9-dialkylfluorene repeat units, benzothiadiazole repeat units, triarylamine repeat units and red emitting repeat units of 4,6-di(2-thienyl)-2,13-benzothiadiazole, as disclosed in WO 00/46321 is deposited from solution over the heated layer of green polymer.

A layer of Ba 16 is deposited onto the blend of blue and red light emissive layer at a thickness of about 4 nm followed and finally a capping layer 18 of aluminium to a thickness of around 250 nm, both of which are applied by thermal evaporation. The device is then encapsulated using a metal enclosure available from Saes Getters Spa (not shown) that is glued to the substrate in order to form an airtight seal.

An electroluminescent emission spectrum from the device structure is shown in FIG. 7 when the device is driven at a voltage providing 100 cd/m². It will be apparent from the emission spectrum that this is a composite of the emission spectra from the two individual layers of green emitting interlayer and the blended red and blue-emitting layer. Emission from the blue material manifests itself as a peak at 464 nm, emission from the green interlayer as a peak at 535 nm and emission from the red as a long-wavelength shoulder on the green peak. In operation, the green interlayer has a smaller bandgap than the blue-emitter component of the blend layer and so does not block excitons or electrons from the blue polymeric layer. The band-gap of the green interlayer is larger than that for the red-emitter such that red-light passes through the green interlayer. Emission in each of these layers takes place by radiative exciton decay.

The organic light emissive region of this device gives a colour slightly to the green side of white emission and has CIE coordinates of (0.34,0.42).

The device of this Example is found to have an external quantum efficiency of up to 1.48%. Accordingly, the device efficiency are high as compared with other known attempts to produce white light emission in OLEDs.

EXAMPLE 4

According to this Example a device having the structure: indium tin oxide/PEDOT/yellow interlayer/blue layer/Ba/Al was fabricated and tested.

A 65 nm layer of PEDOT 13 is deposited by spin-coating formulation Baytron P (RTM) available from H C Starck of Leverkusen, Germany onto an indium tin oxide anode 12 supported on a glass substrate 11 (available from Applied Films, Colorado, USA). A layer of a thin film of electroluminescent organic material 14 is deposited over the PEDOT layer by spin-coating from solution. The organic material is a yellow emissive polymer solution, purchased premixed from the supplier (Merck). Once deposited, this material is heated at a temperature of 180° C. for 1 hour. The thickness was 10 nm. Following cooling a 65 nm layer 15 of a blue electroluminescent polymer is deposited from solution over the heated layers of yellow polymer. Device 3 used blue polymer 1 and Device 1 used blue polymer 2 which had an increased amount of hole transporting unit. The blue polymers are deposited by spin coating from xylene solution.

For both devices, a layer of Barium 16 is deposited onto the blue light emissive layer at a thickness of about 5 nm followed by a capping layer 18 of aluminium to a thickness of around 250 nm, both of which are applied by thermal evaporation. The devices are then encapsulated using a metal enclosure available from Saes Getters Spa (not shown) that is glued to the substrate in order to form an airtight seal.

The electroluminescent emission spectra for both device structures are shown in FIG. 8 when the device is driven at a voltage providing 100 cd/m². It will be apparent from the emission spectra that this is a composite of the emission spectra from the two individual layers of blue and yellow emitting materials. In operation, the yellow interlayer has a smaller bandgap than the blue emitter and so does not block excitons or electrons from the blue polymeric layer. Emission in each of these layers takes place by radiative exciton decay. It is also apparent that in device 1 with increased hole transporting unit, the level of yellow emission is reduced. It is supposed that this is due to an increased number of excitons being formed away from the interlayer/LEP interface, hence reducing the probability of excitons being transferred to the interlayer from the LEP and reducing the yellow emission.

Referring to FIG. 9, the organic light emissive region for device 1 gives a colour close to white emission. The colour lies close to line between the CIE coordinates of the yellow interlayer and the blue light emitting polymer. For device 3 with the reduced hole transport, the colour is shifted along this line towards the blue due to the reduced amount of yellow emission. This example illustrates how the colour can be fine-tuned by altering the amount of transporting unit in the blue emitting polymer. It is expected that altering the hole transporting unit in the interlayer would also have an effect on the overall colour.

The invention claimed is:

1. An organic light emissive device, which comprises:
 an anode;
 a cathode; and
 an organic light emissive region between the anode and the cathode, which region comprises:
 a layer of blue light electroluminescent organic material which emits light having first CIE co-ordinates by exciton radiative decay, wherein the blue light electroluminescent material comprises a polymer and is not doped with an emissive dopant; and
 a further layer of longer wavelength electroluminescent organic material which intrinsically emits light having second CIE co-ordinates by exciton radiative decay, wherein the layer of longer wavelength electroluminescent organic material comprises a polymer; and
 wherein the layers of blue light and longer wavelength materials are selected so that the organic light emissive region emits white light falling within a region having a CIE x coordinate equivalent to that emitted by a black body at 3000-9000K and CIE y coordinate within 0.05 of the CIE y co-ordinate of said light emitted by a black body and wherein each of the electroluminescent materials comprises a solution processable polymer.

2. A device according to claim 1, wherein the longer wavelength electroluminescent organic material is substantially uncrosslinked.

3. A device according to claim 1, wherein the longer wavelength electroluminescent organic material is formed by deposition from solution followed by heat treatment.

4. A device according to claim 1, wherein the longer wavelength electroluminescent organic material is a polymer comprising a repeat unit of formula (I):

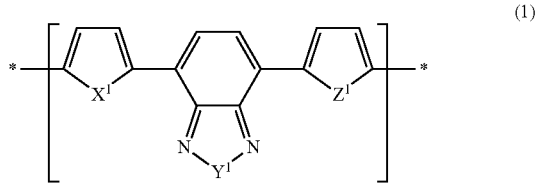

wherein $X^1$, $Y^1$ and $Z^1$ are each independently O, S, $CR_2$, $SiR_2$ or NR; and each R is independently alkyl, aryl or H.

5. A device according to claim 1, wherein the layer of blue light electroluminescent material emits light having a CIE x co-ordinate less than or equal to 0.25 and a CIE y co-ordinate less than or equal to 0.3.

6. A device according to claim 1, wherein the blue light electroluminescent polymer is a polymer comprising at least one of a repeat unit of formulae 1-6:

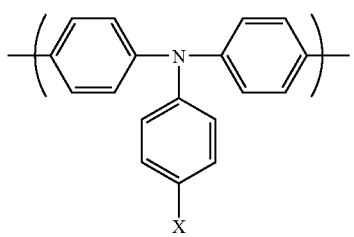

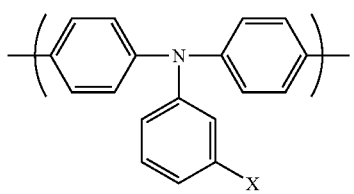

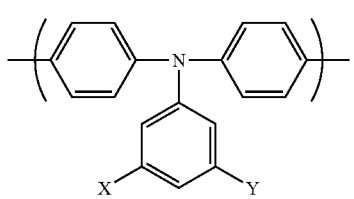

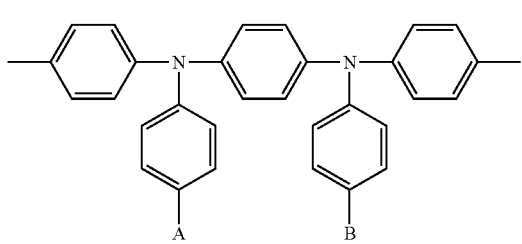

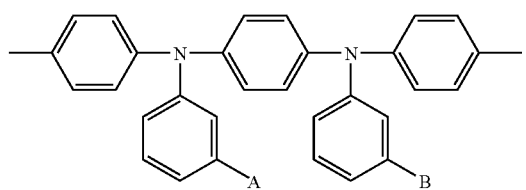

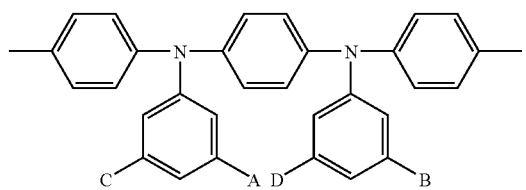

wherein X, Y, A, B, C and D are independently selected from H or a substituent group.

7. A device according to claim 1, wherein the blue light and longer wavelength material are selected so that the organic light emissive region emits the white light in the absence of further emitters.

8. A device according to claim 1, wherein the layer of longer wavelength electroluminescent polymer is positioned between the anode and the layer of blue light electroluminescent material.

9. A device according to claim 1, which further comprises a hole transporting layer positioned between the anode and the organic light emissive region.

10. A backlight for a flat panel display, which comprises a device according to claim 1.

11. A process for the production of an organic light emissive device, which process comprises:
providing an anode;
optionally forming a hole-transporting layer over the anode;
depositing from solution over the anode or hole-transporting layer a first layer of a first electroluminescent organic material which intrinsically emits light at a first wavelength;
depositing from solution a further layer of a second electroluminescent organic material over the layer of the first electroluminescent organic material; and
providing a cathode;
whereby an organic light emissive region is formed between the cathode and the anode which comprises a layer of blue light electroluminescent organic material and a layer of longer wavelength electroluminescent organic material, wherein the blue light electroluminescent material comprises a polymer and is not doped with an emissive dopant, and wherein the layer of longer wavelength electroluminescent organic material comprises a polymer;
wherein the layers of blue light and longer wavelength materials are selected so that the organic light emissive region emits white light falling within a region having a CIE x coordinate equivalent to that emitted by a black body at 3000-9000K and CIE y coordinate within 0.05 of the CIE y co-ordinate of said light emitted by a black body.

12. A process according to claim 11, wherein the first electroluminescent organic material is the longer wavelength electroluminescent organic material.

13. A process according to claim 11, wherein the layer of the first electroluminescent organic material is deposited from solution and is heated; and
the layer of the second organic material is deposited from a solvent in which the first electroluminescent organic material is soluble.

14. A process according to claim 13, wherein the steps of depositing and heating the layer of first electroluminescent organic material are conducted under conditions whereby substantially no crosslinking arises.

15. A process to claim 11, wherein the longer wavelength electroluminescent polymer is a polymer comprising a repeat unit of formula (I)

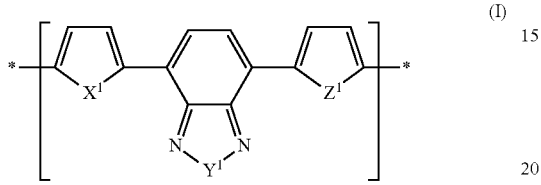

(I)

wherein $X^1$, $Y^1$, and $Z^1$ are each independently O, S, $CR_2$, $SiR_2$ or NR; and each R is independently alkyl, aryl or H.

16. A process according to claim 11, wherein the layer of blue light electroluminescent material emits light having a CIE x co-ordinate less than or equal to 0.25 and a CIE y co-ordinate less than or equal to 0.3.

17. A process according to claim 11, wherein the blue light electroluminescent polymer is a polymer comprising at least one of a repeat unit of formula 1 to 6

1

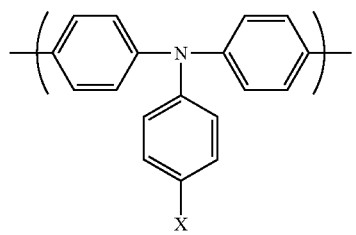

2

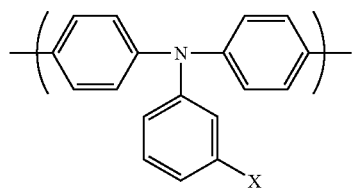

3

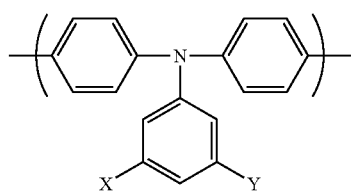

4

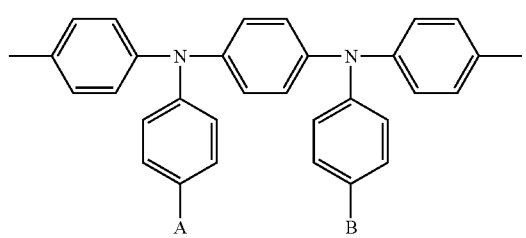

5

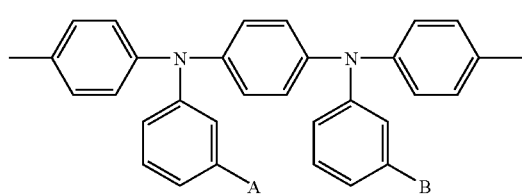

6

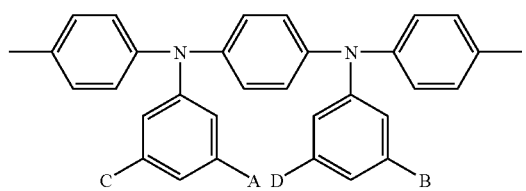

wherein X, Y, A, B, C and D are independently selected from H or a substituent group.

18. A process according to claim 11, wherein the blue light and longer wavelength material are selected so that the organic light emissive region emits the white light in the absence of further emitters.

19. A process according to claim 11, wherein the organic light emissive device comprises a backlight for a flat panel display.

* * * * *